(12) United States Patent
Ohori et al.

(10) Patent No.: US 6,446,806 B1
(45) Date of Patent: Sep. 10, 2002

(54) TRANSPORTATION CONTAINER AND METHOD FOR OPENING AND CLOSING LID THEREOF

(75) Inventors: Shinichi Ohori; Hideaki Aoki, both of Itoigawa (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 09/563,637

(22) Filed: May 2, 2000

(51) Int. Cl.[7] ............................................. B65D 85/48
(52) U.S. Cl. ....................................... 206/454; 206/711
(58) Field of Search .............................. 220/324, 784, 220/786, 788; 206/711, 454; 414/940; 29/453

(56) References Cited

U.S. PATENT DOCUMENTS

| | | | |
|---|---|---|---|
| 4,817,799 A | * | 4/1989 | Gregerson et al. |
| 4,915,913 A | * | 4/1990 | Williams et al. ............ 220/324 |
| 5,024,329 A | * | 6/1991 | Grohrock |
| 5,255,797 A | * | 10/1993 | Kos ............................ 211/41 |
| 5,390,811 A | * | 2/1995 | Ogino et al. ................ 206/711 |
| 5,735,428 A | * | 4/1998 | Chern ......................... 220/324 |
| 5,772,386 A | | 6/1998 | Mages et al. |
| 6,006,919 A | | 12/1999 | Betsuyaku |
| 6,273,261 B1 | * | 8/2001 | Hosoi ......................... 206/711 |

FOREIGN PATENT DOCUMENTS

| | | |
|---|---|---|
| EP | 0 768 706 | 4/1997 |
| EP | 0 987 750 | 3/2000 |
| JP | 0729841 | 6/1995 |
| JP | 08279546 | 10/1996 |
| JP | 09107025 | 4/1997 |

* cited by examiner

Primary Examiner—David P. Bryant
Assistant Examiner—Steven Blount
(74) Attorney, Agent, or Firm—Darby & Darby

(57) ABSTRACT

A transportation container comprises: a container body for housing a plurality of semiconductor wafers; a detachable lid adapted to engage in and cover an open front face of the container body via a seal gasket; and a locking mechanism adapted to fix the lid engaged into the open front face of the container body. The locking mechanism has a pair of protrusions formed at the opposing sides of a rim of the open end face of the container body. The locking mechanism also has a pair of clamp plates which are pivotally supported on the opposing sides of the lid to clamp the protrusions. Each protrusion has, on the back thereof, a groove with a semi-circular cross-section to be clamped. Each clamp plate has attachment shafts for the lid formed in one end of the clamp plate. The clamp plate also has operated parts for automatized operation formed in the other end of the clamp plate. The operated part has a Y-shape in cross-section. Each clamp plate being provided with a U-shaped groove holes to be fitted with the protrusion. A clamping piece is allowed to be inserted and fitted in the clamping groove, so that it is adapted to be bent in the thickness direction of the clamp plate.

16 Claims, 24 Drawing Sheets

TRANSPORTATION CONTAINER AND METHOD FOR OPENING AND CLOSING LID THEREOF

BACKGROUND OF THE INVENTION

1. Field of the Invention

The present invention relates to a transportation container for housing precision substrates typified by semiconductor wafers such as silicon wafers, and a method for opening and closing a lid thereof.

2. Description of the Prior Art

Examples of the types of containers for precision substrates such as semiconductor wafers include process cassettes, open cassettes, production containers used in the carrying of precision substrates within a clean room, and third cassettes, as well as transportation containers used for movement between factories and for shipping Transportation containers of the prior art, as shown in FIG. 1 for example, are configured from a rectangular container body 140 with base, an inner box 141 which is housed within this container body 140 in which a plurality of precision substrates are housed in a row arrangement, a cushon member 142 which contacts the upper end of the plurality of precision substrates, and a freely detachable lid 144 which closes up, by way of a frame-form packing 143, the open upper part of the container body 140. Outward projecting clamp members 145 are arranged in both the left and right sides of the open upper part of the container body 140, and elastic hooks 146 with clamp holes, which fit over the clamp members 145, are arranged in both the left and right sides of the lid 144, and the closed state of the lid 144 with respect to the container body 140 is maintained by virtue of the engagement between the clamp members 145 and the elastic hooks 146. There is a strong demand in transportation containers such as this for, in particular, sealing characteristics, to prevent contamination of the plurality of precision substrates, and for safety, in order to prevent breakage of the precision substrates.

In the field of manufacturing semiconductors, studies have been conducted enthusiastically, aiming at increase in diameter of precision substrate which is demanded as a result of increased size of chips (for example, in semiconductor wafers, from 200 mm to 300 mm), decreasing contamination, and improving the degree of cleanliness of the clean room. In order to realize these objects, automation of related equipment is indispensable. This is because, when the diameter of the precision substrates is increased, the size of containers for housing them is also enlarged, and the weight is thereby increased, whereby the works of operators approximates ergonomics upper limits to make automation of such works necessary. In addition, the works must be automated also because the operators themselves constitute a source of contaminant in the attempts to control contamination of precision substrates and to improve the degree of cleanliness.

In recent years, while attending to the prevention of environmental damages and placing importance on standardization and normalization, researches have been conducted all over the world in order to realize highly automated next-generation semiconductor factories, manufacturing devices, processes, systems, SMIFs (Standard Mechanical Interface) and the like. As a part of these, exhaustive researches have been carried out also on sealed containers for precision substrates, and specific developments, in particular in production containers, are being made.

This type of production containers are known as FOUP (Front Opening Unified Pod) which are, although not shown in the drawings, composed of a container body formed in a front opening box structure, and a lid which opens and closes the open front face of the container body, configured such that they can be connected directly to a substrate processing device, and used as conveyance carriers between processes. A pair of elastic retainers are provided on the interior back face of the container body and on the opposing face of the lid, respectively, to contact and support the outer circumferential edges of the precision substrates. These retainers hold the precision substrates to ensure safety. In addition, a mechanical latching mechanism, which is automatically operated by an automaton machine, is built into the lid, and this mechanical latching mechanism having a large number of components maintains the closed state of the lid with respect to the container body.

Examples of related prior art documents include Japanese Utility Model Application Laid-open Hei 7 No. 29841, and Japanese Patent Application Laid-open Hei 8 No. 279564 and Hei 9 No. 107025. As mentioned in the above, automation is progressing with respect to the production containers for precision substrates, and there is a strong demand for transportation containers of an automation type. In particular, realization of transportation containers that can be used with a degree of cleanliness of less than 1 is strongly expected. Under such circumstances, some extent of standardization and normalization are being carried out also on transportation containers, in other words, FOSBs (Front Opening Shipping Boxes).

However, transportation containers, unlike production containers, require higher sealability and safety in order to cope with harsh transportation conditions as well as the problem of dust invading into the container as a result of pressure fluctuations during air transport, and therefore the clamp members 145 and elastic hooks 146 must be engaged very firmly. Consequently, the operability of the clamp members 145 and elastic hooks 146 is retarded to require very delicate adjustment of force to be used in opening and closing the lid 144, and such work must be done manually by an operator. Further, because the engagement configuration between the clamp members 145 and elastic hooks 146 is complicated, automation of the opening and closing of the lid 144 is very difficult. Still further, unlike the production containers which can be manufactured in relatively small quantity, the transportation containers need to be manufactured in mass, and therefore low cost manufacturing is imperative.

As a method for resolving drawbacks mentioned above and realizing automatic handling of transportation containers, configuration of production containers may be applied to transportation containers. However, in contrast to transportation containers which are designed with much emphasis on strength, production containers are designed as carriers to afford the smooth execution of operations within a factory. Thus, the designing concepts are basically different between these two types of containers and, therefore, those production containers are not suitable for application into transportation containers in view of sealability, safety and durability. In particular, the adoption of a mechanical latching mechanism comprising a plurality of components results in complexity of configuration and cost increase, which constitutes a large impediment to cost reduction.

SUMMARY OF THE INVENTION

The present invention is made with respect to the above-mentioned drawbacks and is directed to provide a transportation container and a method for opening and closing a lid thereof, which are suitable for automation process with good sealability, safety and durability.

In order to achieve the above-mentioned object, the subject matters of the present invention are as follows.

According to a first aspect of the present invention, a transportation container comprises: a container body for housing precision substrates; a detachable lid adapted to engage in and cover an open end face of the container body via a seal gasket, and a locking mechanism adapted to fix the lid engaged into the open end face of the container body, wherein the locking mechanism having a pair of protrusions formed at the opposing sides of a rim of the open end face of the container body, and having a pair of clamp plates which are swingably journaled on opposing sides of the lid to clamp the protrusions, each protrusion having, on the back thereof, a groove to be clamped, each clamp plate having attachment shafts for the lid formed in one end of the clamp plate and operated parts for automatic operation formed in the other end, each clamp plate being provided with an approximately U-shaped groove holes to be fitted with the protrusion, thereby a clamping piece of an approximately rectangular shape to be inserted and fitted in the clamping groove, such that it can be bent in the thickness direction of the clamp plate.

According to a second aspect of the present invention, the transportation container as defined in the first aspect further comprises: each clamp plate is formed with a synthetic resin and at least a part of the other end of the clamp plate is bent in the direction either toward the front or the back side of the clamp plate to form the operated parts, one or more rotation-restricting projections being provided around the attachment shaft.

According to a third aspect of the present invention, the transportation container as defined in the first aspect further comprises: a bottom plate, made of a synthetic resin such as polycarbonate, is detachably disposed to the center of the base of the container body.

According to a fourth aspect of the present invention, the transportation container as defined in the first aspect further comprises: a positioning member with a cross section of approximately inverse V-shape is arranged at the base of the container body.

According to a fifth aspect of the present invention, the transportation container as defined in the first aspect further comprises: a plurality of housing grooves having a cross section of laid-down U-shape are vertically arranged in parallel in the opposing left and right sides inside the container body.

According to a sixth aspect of the present invention, the transportation container as defined in the first aspect further comprises: the attachment shafts for the clamp plates are fixed to the opposing sides of the lid, and swinging hinges are formed linearly along the interface of the clamp plates and attachment shafts in such a way that the clamp plates are able to swing around them.

According to a seventh aspect of the present invention, a method for opening and closing a lid of a transportation container comprises: the transportation container comprising; a container body for housing precision substrates, a detachable lid adapted to engage in and cover an open end face of the container body via a seal gasket, and a locking mechanism adapted to fix the lid engaged into the open end face of the container body, wherein the locking mechanism having a pair of protrusions formed at the opposing sides of a rim of the open end face of the container body, and having a pair of clamp plates which are swingably journaled on opposing sides of the lid to clamp the protrusions, each protrusion having, on the back thereof, a groove to be clamped, each clamp plate having attachment shafts for the lid formed in one end of the clamp plate and operated parts for automatic operation formed in the other end, each clamp plate being provided with an approximately U-shaped groove holes to be fitted with the protrusion, thereby a clamping piece of an approximately rectangular shape to be inserted and fitted in the clamping groove, such that it can be bent in the thickness direction of the clamp plate; a transportation mechanism for moving a mounting base for mounting the container body of the transportation container back and forth between an operating region and a supply/discharge region; a plurality of positioning members for positioning the container body on the mounting base; a lift mechanism adapted to move up and down a support base between the operation region and a siding region; a clamp mechanism mounted on the support base of the lift mechanism to hold the lid; and operation mechanisms mounted on opposing sides of the support base, the operation mechanisms being adapted to allow the clamp plates of the locking mechanism to swing into a release position where the lid can be removed from the container body from the state engaged with the open end face of the container body, the operation mechanisms being also adapted to allow the clamp plates of the locking mechanism to swing into a close position where the lid is fixed to the open end face of the container body, wherein the method comprising: positioning and mounting the container body on the mounting base of the transportation mechanism through a plurality of positioning members; lifting the support base of the lift mechanism from the siding region to the operation region; advancing the mounting base of the transportation mechanism from a supply/discharge region to the operation region to hold the lid by the clamp mechanisms; swinging the clamp plates into the release position where the lid can be removed; retracting the mounting base from the operation region to the supply/discharge region to separate the lid from the container body; and lowering the support base from the operation region to the siding region.

According to an eighth aspect of the present invention, a method for opening and closing a lid of a transportation container comprises: a transportation container comprising; a container body for housing precision substrates, a detachable lid adapted to engage in and cover an open end face of the container body via a seal gasket, and a locking mechanism adapted to fix the lid engaged into the open end face of the container body, wherein the locking mechanism having a pair of protrusions formed at the opposing sides of a rim of the open end face of the container body, and having a pair of clamp plates which are swingably journaled on opposing sides of the lid to clamp the protrusions, each protrusion having, on the back thereof, a groove to be clamped, each clamp plate having attachment shafts for the lid formed in one end of the clamp plate and operated parts for automatic operation formed in the other end, each clamp plate being provided with an approximately U-shaped groove holes to be fitted with the protrusion, thereby a clamping piece of an approximately rectangular shape to be inserted and fitted in the clamping groove, such that it can be bent in the thickness direction of the clamp plate; a transportation mechanism for moving a mounting base for mounting the container body of the transportation container back and forth between an operating region and a supply/discharge region; a plurality of positioning members for positioning the container body on the mounting base; a lift mechanism adapted to move up and down a support base between the operation region and a siding region; a clamp mechanism mounted on the support base of the lift mechanism to hold the lid; and operation mechanisms mounted on opposing sides of the support base, the operation mechanisms being adapted to allow the clamp plates of the locking mechanism to swing into a release position where the lid can be removed from the container body from the state engaged with the open end face of the container body, the operation mechanisms being also adapted to allow the clamp plates of the locking mechanism to swing into a close position where the lid is fixed to the open end face of the container body, in which the lid previously held by the clamp mechanism being engaged and fixed in the container body positioned and mounted on the mounting base through a plurality of positioning members, the method comprising:

lifting the support base of the lift mechanism from the siding region to the operation region to position the lid in the operation region; advancing the mounting base of the transportation mechanism from a supply/discharge region to the operation region to engage the lid with the open end face of the container body; swinging the clamp plates of the locking mechanism, by the operation mechanism, to the close position where the lid is fixed to the container body; releasing the lid by the clamp mechanisms; and lowering the support base from the operation region to the siding region.

According to a ninth aspect of the present invention, the method for opening and closing a lid of a transportation container as defined in the seventh aspect further comprises: the transportation mechanism is arranged between the operation region and the supply/discharge region, the transportation mechanism comprising a first guide member adapted to engage in the mounting base, and a first driver for use in sliding the mounting base horizontally in the longitudinal direction of the first guide member, the fixing mechanism for fixing the container body on the mounting base comprising a plurality of second drivers attached to the mounting base, and a plurality of fixing arms provided retractably on opposing sides of the mounting base, projected from the mounting base so as to clamp the sides of a lower part of the container body when the second drivers are operated.

According to a tenth aspect of the present invention, the method for opening and closing a lid of a transportation container as defined in the eighth aspect further comprises: the transportation mechanism is arranged between the operation region and the supply/discharge region, the transportation mechanism comprising a first guide member adapted to engage in the mounting base, and a first driver for use in sliding the mounting base horizontally in the longitudinal direction of the first guide member, the fixing mechanism for fixing the container body on the mounting base comprising a plurality of second drivers attached to the mounting base, and a plurality of fixing arms provided retractably on opposing sides of the mounting base, projected from the mounting base so as to clamp the sides of a lower part of the container body when the second drivers are operated.

According to an eleventh aspect of the present invention, the method for opening and closing a lid of a transportation container as defined in the seventh aspect further comprises: the lift mechanism is arranged between the operation region and the siding region, the lift mechanism comprising a second guide member adapted to guide the support base in vertical direction, and a third driver for use in moving up and down the support base in the longitudinal direction of the second guide member, the clamp mechanism comprising a plurality of fourth drivers attached to the support base via a standing member, and a plurality of clamp arms adapted to hold the sides of the lid when the fourth drivers are operated.

According to a twelfth aspect of the present invention, the method for opening and closing a lid of a transportation container as defined in the eighth aspect further comprises: the lift mechanism is arranged between the operation region and the siding region, the lift mechanism comprising a second guide member adapted to guide the support base in vertical direction, and a third driver for use in moving up and down the support base in the longitudinal direction of the second guide member, the clamp mechanism comprising a plurality of fourth drivers attached to the support base via a standing member, and a plurality of clamp arms adapted to hold the sides of the lid when the fourth drivers are operated.

According to a thirteenth aspect of the present invention, the method for opening and closing a lid of a transportation container as defined in the seventh aspect further comprises: the operation mechanism comprises a pair of third guide members with an approximately semi-circular cross section on opposing sides of the support base; a pair of sliding members slidably engaged with the third guide members, respectively, the sliding members moving close to and away from the periphery of the lid in response to the operation of a fifth driver; a plurality of presser arms attached to the sliding members, respectively, the presser arms move close to and away from the clamping pieces of the clamp plate in response to the operation of a sixth driver; and a plurality of operation arms attached to the sliding members, respectively, the operation arms move close to and away from the operated parts of the clamp plate in response to the operation of a seventh driver.

According to a fourteenth aspect of the present invention, the method for opening and closing a lid of a transportation container as defined in the eighth aspect further comprises: the operation mechanism comprises a pair of third guide members with an approximately semi-circular cross section on opposing sides of the support base; a pair of sliding members slidably engaged with the third guide members, respectively, the sliding members moving close to and away from the periphery of the lid in response to the operation of a fifth driver; a plurality of presser arms attached to the sliding members, respectively, the presser arms move close to and away from the clamping pieces of the clamp plate in response to the operation of a fifth driver; and a plurality of operation arms attached to the sliding members, respectively, the operation arms move close to and away from the operated parts of the clamp plate in response to the operation of a seventh driver.

According to the present invention, in order to engage the lid in the open front end of the container body of the transportation container and fix it therein, the lid is engaged and fixed in the open front end of the container body via the seal gasket for sealing and the clamp plates are moved toward each other by means of the operated parts in the direction of the opposing sides of the container body to close the clamp plates, thereby fitting the protrusions in the grooves and bending the holding pieces into the grooves to be clamped. The clamp plates are then clamped further by means of the operated parts in the direction of the opposing sides of the container body. The resultant elastic reaction force of the holding pieces provides fixation of the lid in the open front end of the container body.

On the other hand, in order to move the clamp plates to a release position where the lid can be removed that has been engaged with the open front end of the container body, the clamp plates are moved by means of the operated parts such that they swing to the release position from the opposing sides of the container body to separate the clamp plates from each other. Then, the holding pieces are bent and removed from the grooves to be clamped. This makes it possible to remove the lid engaged with the open front end of the container body.

In addition, according to the present invention, the clamp plates, the attachment shafts, the operated parts, and the holding pieces are integrally formed with predetermined synthetic resin, they can be mass-produced at a low cost. Furthermore, the flexibility and the elasticity can be provided with simple configuration and method. Moreover, the operated parts are formed to be bent toward either the top or the back surface of the clamp plates. This allows the arms and/or hooks for automatic operations to be contacted with the operated parts for engagement.

In addition, according to the present invention, in order to move the clamp plates such that the lid can be removed that has been engaged with the open front end of the container body of the transportation container, the seventh driver is operated to contact the operated parts of the clamp plates of the container body with the operation arms to engage them with each other. In this event, the holding pieces of the clamp plates are generally opposed to the pressing arms from the sides thereof. When the pressing arms are opposed to the holding pieces of the clamp plates, the sliding members are guided by the third guide member and away from the lid, along an approximately arc-shaped track. Then, the operation arms swing to a release position and the sixth driver is driven to contact strongly the pressing arms to the holding pieces of the clamp plates. The holding pieces are thus bent and away from the grooves to be clamped. The lid is now ready to be removed. The seventh driver is driven to separate the operation arms from the operated parts of the clamp plates.

On the other hand, in order to fix and secure the lid engaged with the open front end of the container body, the fifth driver is driven. The sliding members are guided by the third guide member and move closer to the lid along an approximately arc-shaped track. The clamp plates previously held by the operation arms swing to a close position and the sixth driver is driven to contact strongly the pressing arms to the holding pieces of the clamp plates. This results in bending of the holding pieces into the grooves to be clamped. As a result, the lid is fixed in the open front end of the container body. The seventh driver is driven to separate the operation arms from the operated parts of the clamp plates.

BRIEF DESCRIPTION OF THE DRAWINGS

FIGS. 6A, 6B, and 6C are views for use in describing a clamp plate of a locking mechanism of the transportation container according to an embodiment of the present invention, in which FIG. 6A is a front view of the clamp plate, FIG. 6B is a cross-sectional view taken on the line 200–201 in FIG. 6A, and FIG. 6C is a cross-sectional view taken on the line 202–203 in FIG. 6A;

FIGS. 7A and 7B are cross-sectional view for use in describing how the clamp plate of the locking mechanism is used in the transportation container according to an embodiment of the present invention, in which FIG. 7A shows the clamp plate being in use, and FIG. 7B shows the clamp plate being released;

FIGS. 17A, 17B, and 17C are views for use in describing an operation mechanism of a device for carrying out a method for opening and closing the lid of the transportation container according to an embodiment of the present invention, in which FIG. 17A is a view for use in describing an operation arm in the state not being locked with operated parts of a clamp plate, FIG. 17B is a view for use in describing the operation arm with being locked with the operated parts of the clamp plate, and FIG. 17C is a view for use in describing the state where the operation arm and the operated parts of the clamp plate to swing into a release position while being locked with each other;

FIGS. 18A and 18B are views for use in describing a method for opening and closing a lid of a transportation container according to an embodiment of the present invention, in which FIG. 18A is a plan view of a container body being positioned and mounted on a mounting base, and FIG. 18B is a side view of the container body in FIG. 18A;

FIGS. 19A and 19B are views for use in describing a method for opening and closing a lid of a transportation container according to an embodiment of the present invention, in which FIG. 19A is a plan view of a mounting base being advanced in an operation region, and FIG. 19B is a side view of the mounting base in FIG. 19A;

FIGS. 20A and 20B are views for use in describing a method for opening and closing a lid of a transportation container according to an embodiment of the present invention, in which FIG. 20A is a plan view of a clamp plate of a lid after swinging into a release position where the lid can be removed, and FIG. 20B is a side view of the clamp plate in FIG. 20A;

FIGS. 21A and 21B are views for use in describing a method for opening and closing a lid of a transportation container according to an embodiment of the present invention, in which FIG. 21A is a plan view of a container body being removed from a lid, and FIG. 21B is a side view of the container body in FIG. 21A;

FIGS. 22A and 22B are views for use in describing a method for opening and closing a lid of a transportation container according to an embodiment of the present invention, in which FIG. 22A is a plan view of a lid being lowered from an operation region to a siding region, and FIG. 22B is a side view of the lid in FIG. 22A;

FIGS. 23A and 23B are views for use in describing a method for opening and closing a lid of a transportation container according to an embodiment of the present invention, in which FIG. 23A is a plan view of a mounting base being advanced again in an operation region, and FIG. 23B is a side view of the mounting base in FIG. 23A; and FIGS. 24A and 24B are comparative views for use in describing an effect of a method for opening and closing a lid of a transportation container according to an embodiment of the present invention, in which FIG. 24A is a plan view and FIG. 24B is a side view of FIG. 24A.

DESCRIPTION OF THE PREFERRED EMBODIMENTS

Figure 1:
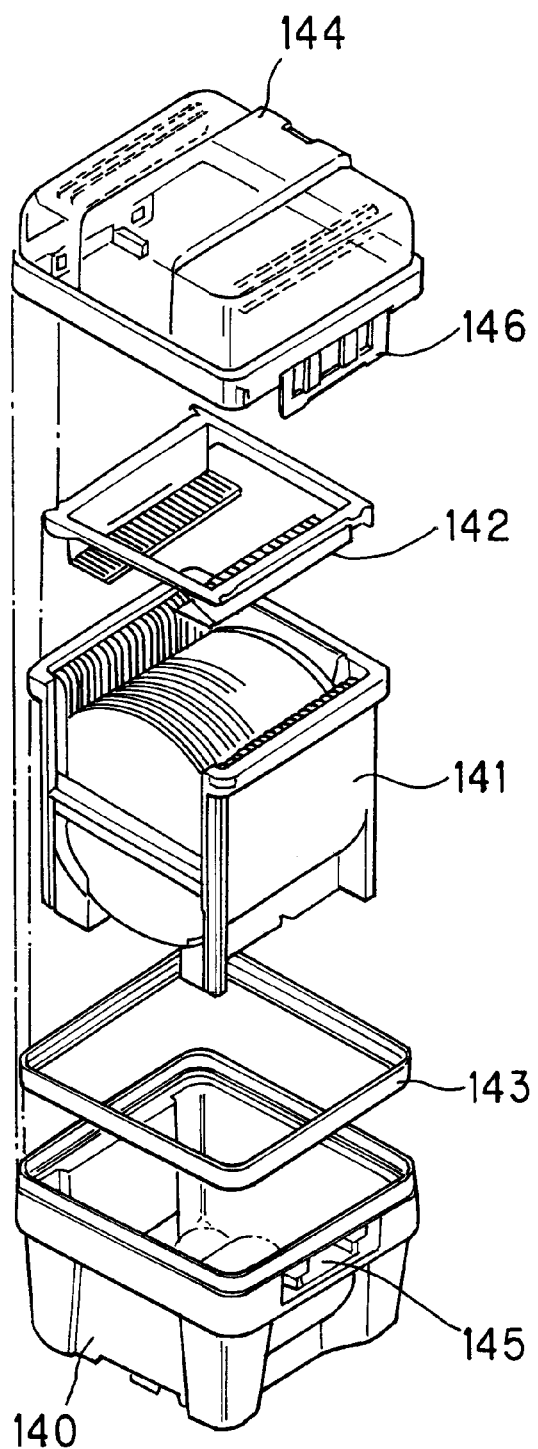
FIG. 1 is an exploded perspective view illustrating a conventional transportation container.

A description is given below, with reference to the drawings, of a preferred embodiment of the transportation container pertaining to the present invention, talking an example of housing semiconductor wafers. However, the present invention is not limited to the embodiment described below.

Here, precision substrates in the present invention include a singular number or plurality of (by way of example 13, 25) aluminum disks, liquid crystal cells, quartz glass, semiconductor wafers such as silicon wafers or test wafers, and mask substrates which are used in the fields of information communication, electrical and electronical equipment or semiconductors manufacturing. In addition, the container body, lid and clamp plates of the locking mechanism can be formed, as appropriate, using a variety of synthetic resins such as polycarbonate, acrylic resins, polybutylene terephthalate, polyetheretherketone, polyether imide, polyether sulfone, polypropylene and the like. It is possible, if necessary, to administer to the container body or lid an antistatic treatment or coloring. In addition, the seal gasket can be formed using a polyolefine. group or polyester group thermoplastic elastomer, fluororubber or the like.

The clamp plates, holding pieces and operated parts of the locking mechanism may be formed from the same material but they may also be formed from a plurality of synthetic resins or a combination of a leaf spring with synthetic resins and the like. The mounting shafts for the clamp plates can be attached either rotatably or in a fixed state to the opposing sides of the lid. Further, the groove holes of approximately U-shape include an approximately inversed C-shape, an approximately C-shape, and other shapes which are generally similar thereto. It is preferable that the shape of the operated part be an approximately Y-shape, L-shape, laid-down L-shape or shape approximately similar thereto. In addition, a number of a plurality of positioning members may be at least 3.

Examples of a 1st to 7th driver include air cylinders, hydraulic cylinders, combination of gear mechanisms (rack and pinion etc.) and a variety of motors, or combination of a variety of motors, screw rods and nuts which fit with the screw rods, which are provided singularly or in a plural number suitable for use in clean rooms. Furthermore, examples of the clamp mechanism which can be employed include, in addition to a structure which holds and clamps the lid from opposing sides using a plurality of clamp arms, a structure which holds and clamps one or more ribs or the like provided on the lid surface from opposing sides using clamp arms, or a structure in which one or more pads are caused to contact the lid surface and held by vacuum suction. Furthermore, the clamp mechanism may have either one or more upright members so far as suitable for attachment of a fourth driver.

Next, the transportation container in the present embodiment comprises, as shown in FIGS. 2 to 7, a container body 1 for housing a plurality of semiconductor wafers W, a detachable lid 9 which fits in and sealingly covers the open front face of the container body 1, and a locking mechanism 17 which fixes the lid 9 fitted into the open front face of the container body 1 or enables it to be removed.

Figure 2:
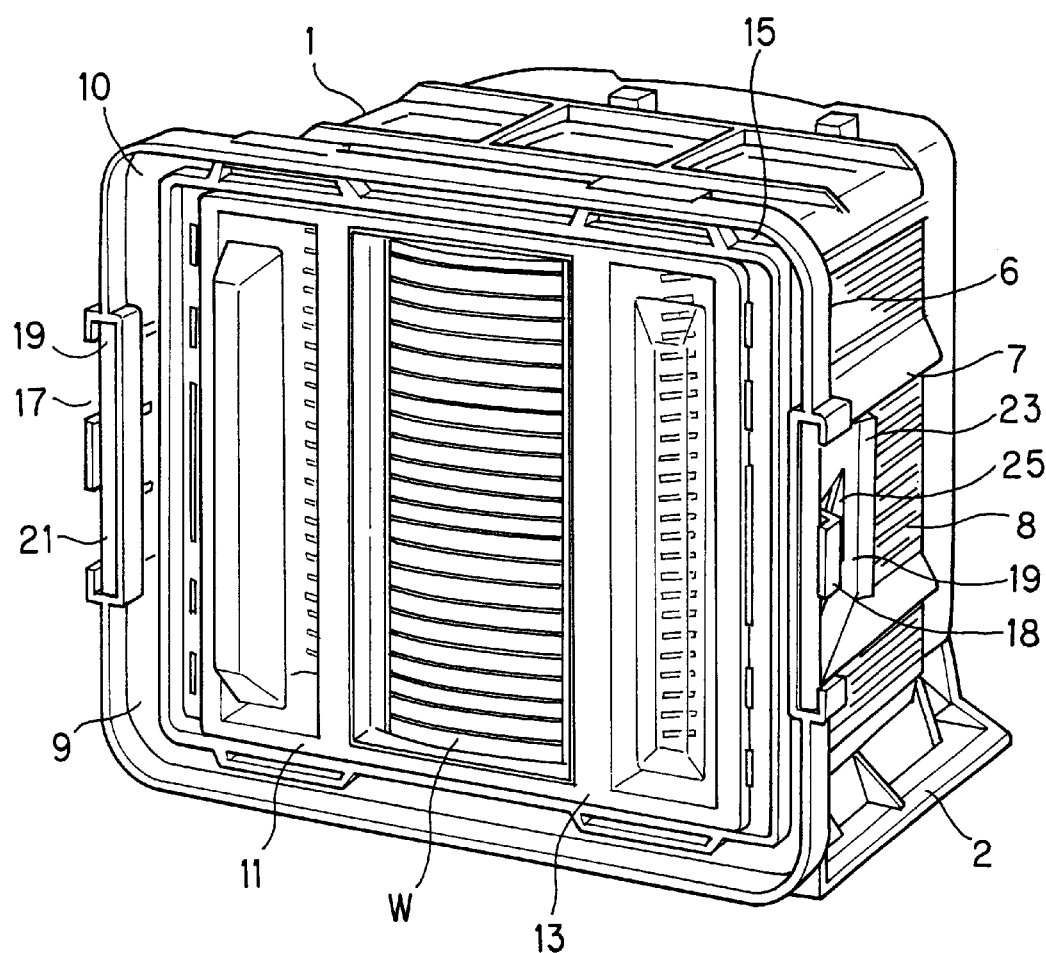
FIG. 2 is a whole perspective view illustrating a transportation container according to an embodiment of the present invention.
Figure 3:
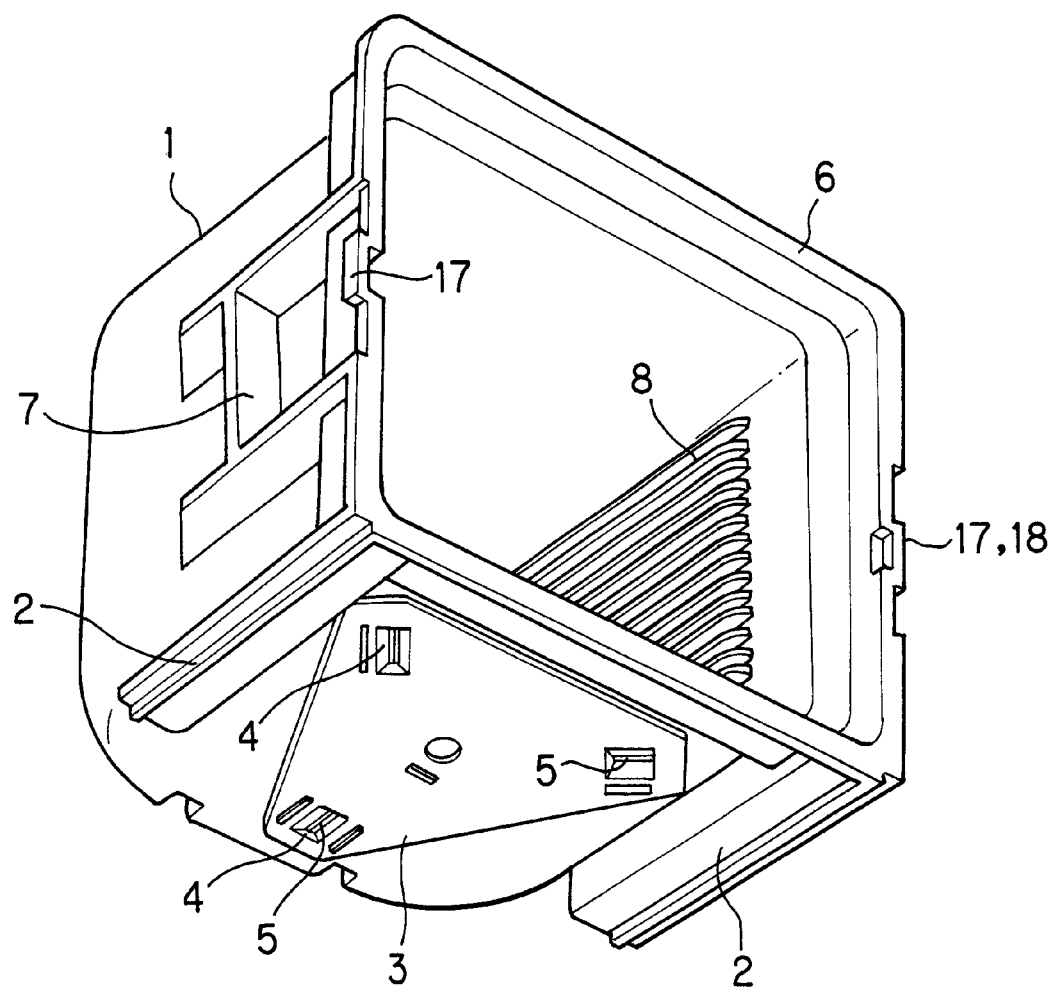
FIG. 3 is a perspective view illustrating a transportation container according to an embodiment of the present invention, in which the container body is seen from the bottom side thereof.

The container body 1, as shown in FIGS. 2 and 3, is constituted into a transparent front open box structure formed of a polycarbonate which has good shock resistance, heat resistance, water resistance and acid resistance, and in which sufficient strength, rigidity and dimensional stability and so on are ensured. Bottom rails 2 are integrally formed respectively in opposing sides of the base of the container body 1, and the bottom rails 2 project downwards and extend forward and rearward, while jutting out in the left and right side directions. A bottom plate 3, made of a synthetic resin such as polycarbonate, is detachably fastened by screws to the center of the base of the container body 1, and a positioning member 4 with a cross section of approximately inverse V-shape is arranged in predetermined positions as established by the SEMI standards of the bottom plate 3, in other words, at the center of rear part and the opposing sides of front part thereof. In each positioning member 4, a concave parts 5 is defined such that its width gradually narrows from the tip end toward the center thereof.

As required, a handle not shown in the drawing may be removably mounted by screws to the center of ceiling of the container body 1, and this handle is detachably held by a carrier such as an OHT (Overhead Hoist Transport) or the like. In addition, as shown in FIGS. 2 and 3, a rim 6 is formed around the outer circumference of the open front face of the container body 1 such that it projects outward from the upper, lower, left and right edges. The opposite ends of the lower part of the rim 6 are formed integrally with the front edge of the pair of bottom rails 2. Further, a manual handle 7 having an approximately laid-down H-shape is formed on the left and right sides of the container body 1 protruding therefrom, and the front end of each handle 7 and the center of the side of the rim 6 are formed integrally.

A pair of rear supports not shown in the drawing are provided upright and fixed by screws to the inner back face of the container body 1 while they are separated transversely (in relation to this point, see FIG. 10 etc.), and a plurality of support grooves which have a cross section of laid-down V shape are formed in the vertical direction in parallel in the surface of the rear supports. Further, as shown in FIGS. 2 and 3, a plurality of housing grooves 8 having a cross section of laid-down U-shape are vertically arranged in parallel in the opposing left and right sides inside the container body 1, so that this plurality of housing grooves 8 horizontally supports the plurality of semiconductor wafers W at a predetermined same pitch such that those wafers W will not contact each other. When the semiconductor wafers W are housed in this manner, the rear supports support the semiconductor wafers W to effectively prevent the semiconductor wafers W from being damaged during transportation.

Figure 4:
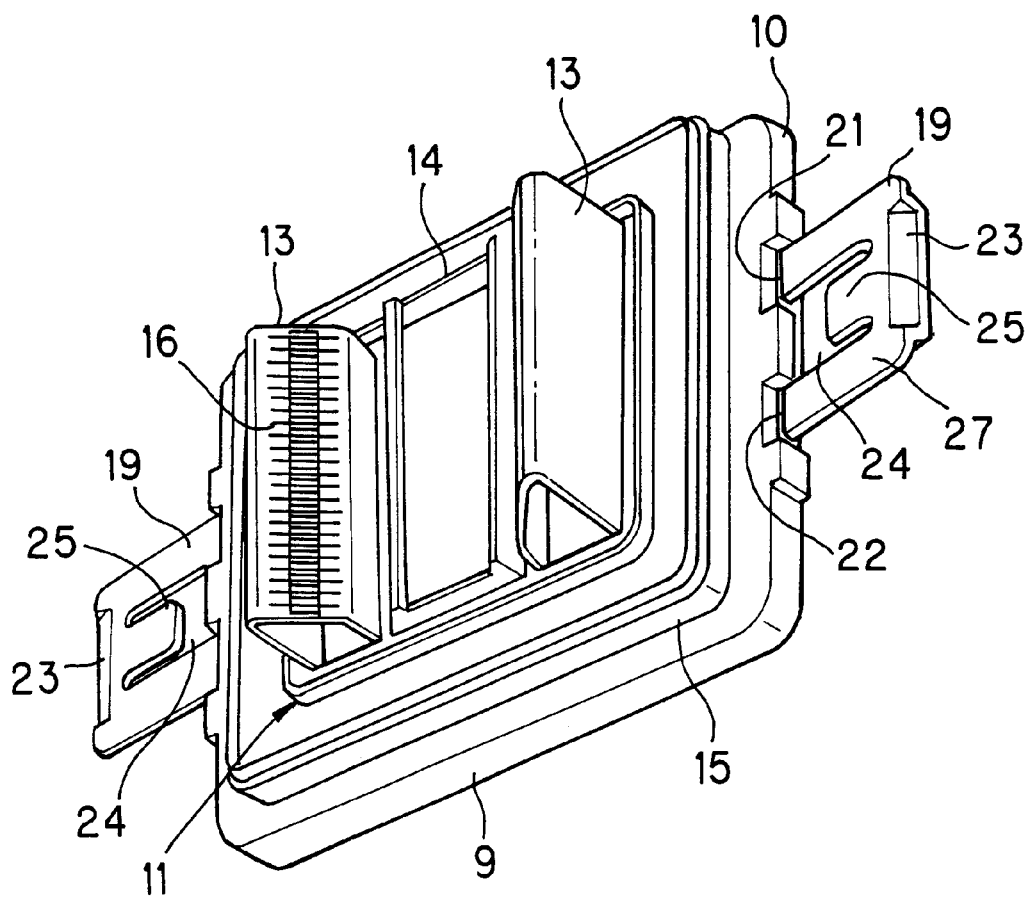
FIG. 4 is a perspective view illustrating a back surface of a lid of the transportation container according to an embodiment of the present invention.
Figure 5:
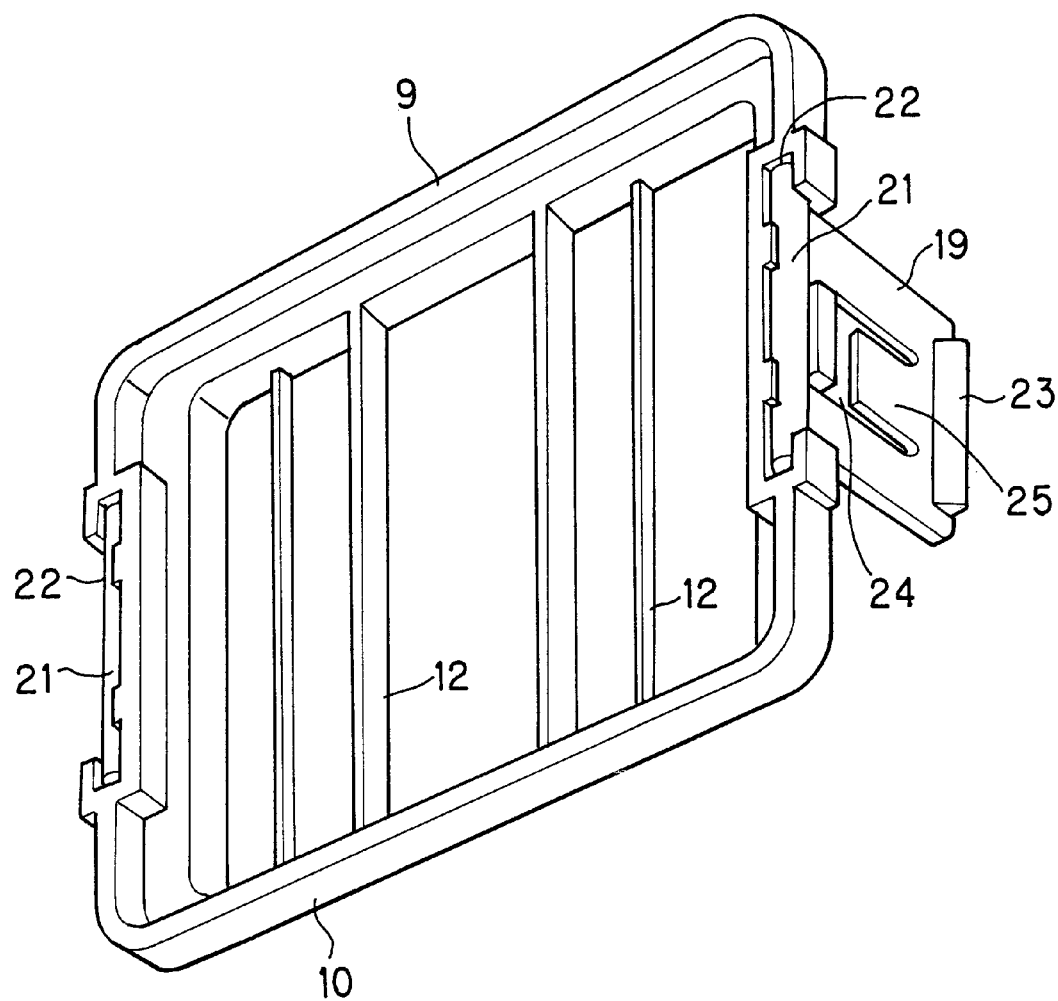
FIG. 5 is a perspective view of a lid of the transportation container according to an embodiment of the present invention, with a front retainer being removed from the lid.

The lid 9, as shown in FIGS. 2 and 4, comprises a transparent surface plate 10 formed using a polycarbonate, and a colored front retainer 11 detachably mounted to the open front face of the surface plate 10. The surface plate 10 and front retainer 11 are formed, basically, in rectangular shape, and the four corners thereof are chamfered round to suppress cracks or breaks. The surface plate 10, as shown in FIG. 5, is formed in a box shape of approximately inversed C-shape cross section. On the inner surface of the plate 10, reinforcing ribs 12 extending vertically are formed next to each other in the lateral direction in the inner surface, and a plurality of locking grooves or protrusions not shown in the drawing are provided for the purpose of mounting the retainer.

The front retainer 11 is formed using for example, in the same way as the rear support, a polyester group elastomer, polyolefin group elastomer, elastic polypropylene, or elastic polyethylene. In the present embodiment, taking durability during use into consideration, the front retainer 11 is formed using an optimum polyester group elastomer whose bending elastic modulus lies in the range of 500 to 1,500 kgf/cm$^2$ when measured in accordance with ASTMD 790. This front retainer 11, as shown in FIG. 4, comprises a pair of holding supports 13 positioned respectively in the left and right sides of the open surface of the surface plate 10 and inserted about 20 mm to 60 mm inward from the open front face of the container body 1, and a frame-shaped connector 14 which connects the pair of holding supports 13. In addition, a seal gasket 15 is provided in the side of the lid 9 such that it is interposed between the lid 9 and the container body The holding supports 13, as shown in the same drawing, are formed in an angular column shape with a cross section of trapezoid shape, and a plurality of support grooves 16 with a cross section of inverse V-shape are vertically arranged in rows in the inclined surface thereof. The plurality of support grooves 16 support semiconductor wafers W together with the rear supports so as to prevent the semiconductor wafers W from friction, contamination, impact and vibration during transportation. The pluralities of support grooves 16 are formed in such a way that the center angle of the contact point with the semiconductor wafers is 60° to 120° and preferably 100° to 120°. In addition, a plurality of locking hooks not shown in the drawing are formed to project from the connector 14, and by the locking of this plurality of locking hooks into the plurality of locking grooves, the connector 14, or to put it another way, the front retainer 11, is mounted and fixed to the surface plate 10. Further, the seal gasket 15 is formed into a deformable frame shape using, for example, a silicone rubber or a thermoplastic elastomer of a polyolefin group or a polyethylene group which has good heat resistance, moisture resistance, chemical resistance, aging resistance, and electrical characteristics.

Figure 6A:
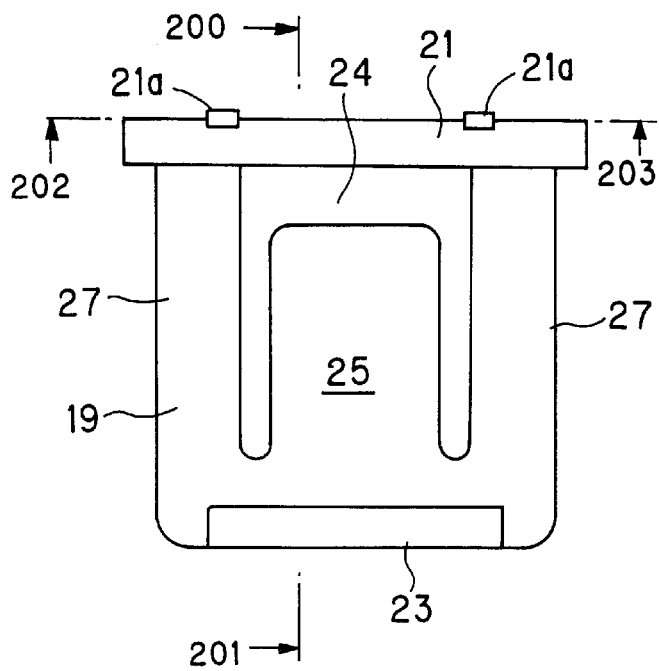
Figure 6B:
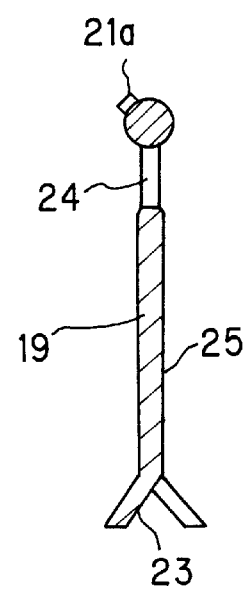
Figure 6C:
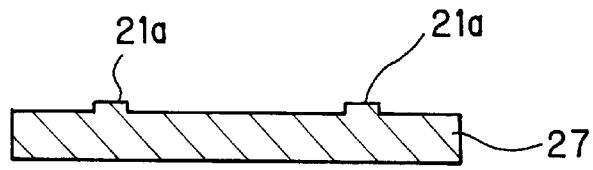
Figure 7A:
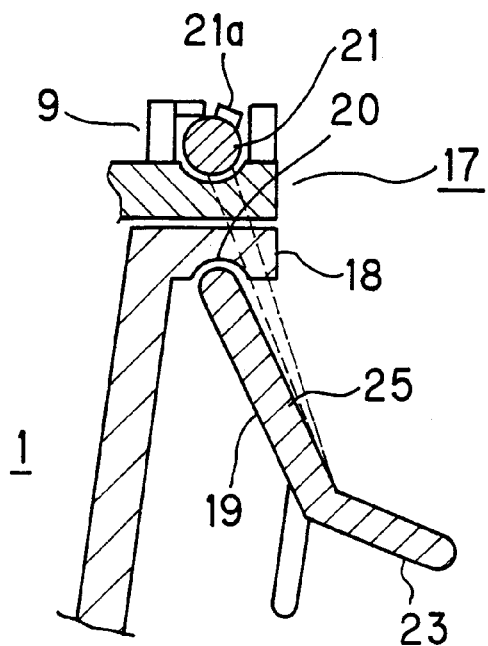
Figure 7B:
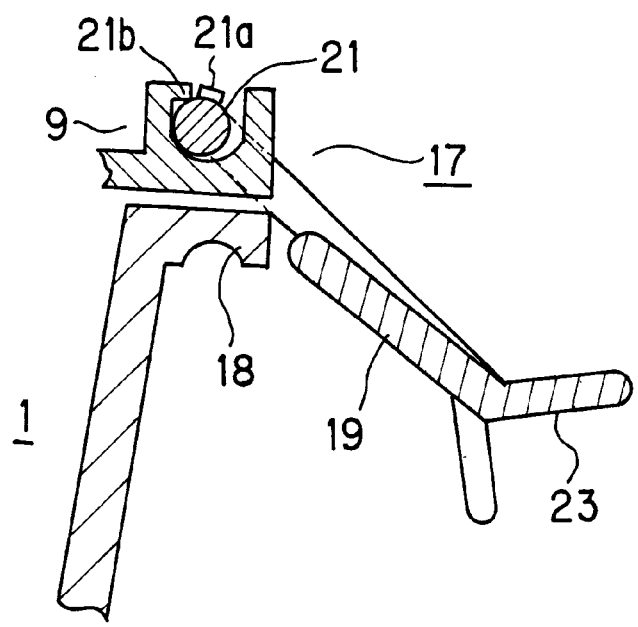

The locking mechanism 17, as shown in FIGS. 2 to 7B, comprises a left/right pair of protrusions 18 formed integrally at the center of the opposing sides of the rim 6 of the container body 1 so as to protrude therefrom, and a pair of clamp plates 19 which are swingably journaled on opposing sides of the lid 9 to clamp the protrusions 18. In the front face of the protrusions 18, as shown in FIG. 3 and FIGS. 7A and 7B, a stepped groove is defined so that the clamp plate is fitted in it, and, in the rear face thereof, grooves to be clamped 20 with a semi-circular cross section are formed. In addition, the clamp plates 19, as shown in FIGS. 6A and 6B, are formed from a polycarbonate basically into a square shape, and the corner of the free end (bottom transverse part in FIG. 6A) are chamfered round.

As shown in FIG. 2, FIG. 6A, FIG. 6B, FIG. 7A, and FIG. 7B, an attachment shaft 21 of circular column shape is integrally formed in one end of the clamp plate 19, and the attachment shaft 21 is inserted in and journaled by a housing part 22 on the side of the lid. It is preferable to dispose at least one or a plurality of projection 21a as rotation stopper on backside of the attachment shaft 21 so as to prevent excessive rotation of the attachment shaft 21 as the clamp plates 19 of the lid 9 are released. The projection 21a as rotation stopper is, as shown in FIG. 7B, abutted, as clamping by the clamp plates 19 between the lid 9 and the container body 1 is released, to a stopper position 21b disposed either at the side wall of the housing part 22 or at the opening continuously formed from the side wall, thus to serve as the rotation stopper. The shape of the projection 21a as rotation stopper may be, as front view, a rectangular, circular, elliptical, rod-like, etc., while as cross-sectional view, the shape may be trapezoidal, rectangular, circular, etc. Here, the projection 21a as rotation stopper may be disposed in plurality with a certain distance in between, or may be disposed in single continuous rod-shape. The most part of the free end of the clamp plates 19, as shown in FIG. 4 to FIGS. 6A and 6B, is bent in the direction toward front surface (rightward in FIGS. 7A and 7B) of the clamp plates 19, and the operated parts 23 (also referred to herein as beveled or engaging sections of the clamp plates 19) for automatic operation which have a Y-shaped or approximately L-shaped cross-section are integrally defined therewith. Furthermore, the clamp plate 19 is provided with an approximately U-shaped groove holes to be fitted with the protrusion 18, and by this groove hole 24, a clamping piece 25 of an approximately rectangular shape to be inserted and fitted in the clamping groove 20, is defined such that it can be bent in the thickness direction of the clamp plate 19 (in the direction toward the rear on the paper in FIG. 6A, and transverse direction in FIG. 6B, which is a cross-sectional view taken on the line 200–201 in FIG. 6A). The clamping piece 25 has elasticity, and the edge of the free end to be inserted and fitted in chamfered round. FIG. 6C is a cross-sectional view taken on the line 202–203 in FIG. 6A.

Figure 17A:
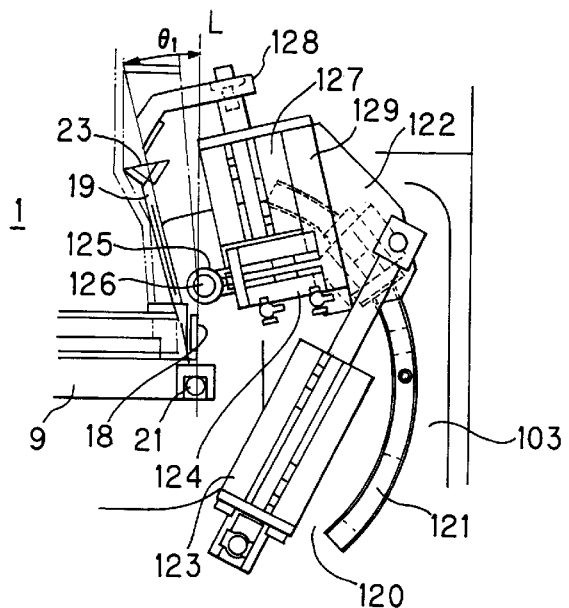
Figure 17B:
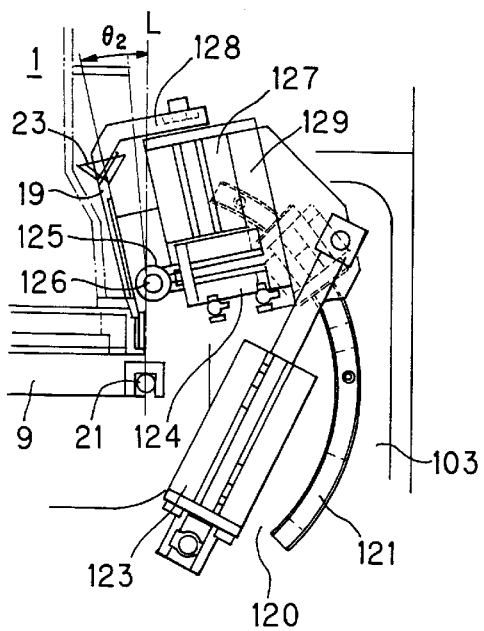
Figure 19A:
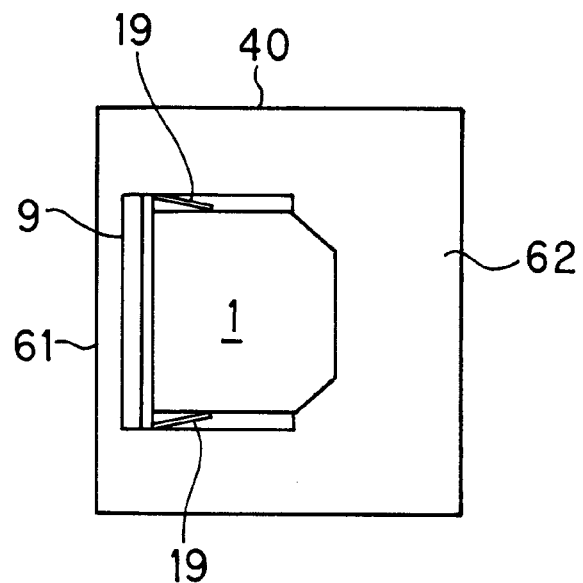
Figure 19B:
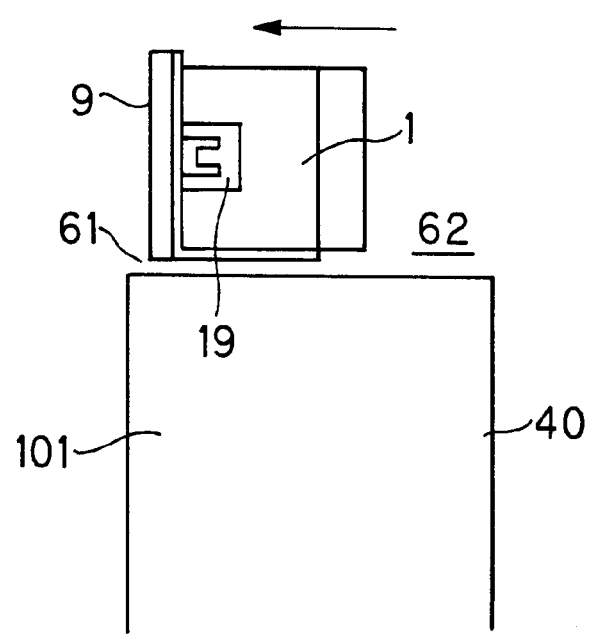

In the above-described configuration, in order to fit and fix the lid 9 to the open front face of the container body 1, the lid 9 is firstly fitted to the open front face of the container body 1 to establish a sealed state by way of a seal gasket 15, then the clamp plates 19 are caused to swing in the both right and left directions of the container body 1, by the use of a protruding operated part 23, so as to insert the protrusion 18 the groove holes 24 and to insert the clamping piece 25 into the clamping grooves 20 while bending the same, and an angle θ made between the clamp plate 19 and the reference line L of FIGS. 17A and 19B (a line passing through the center of the attachment axis 21 and orthogonally intersecting with the open front face of the container body 1) is set within the range of 5° to 10°.

If the clamp plates 19 are caused to swing further in the transverse direction of the container body 1 using the operated parts 23 to make the angle θ between the reference line L and clamp plates 19 of within the range of −5° to −20°, the lid 9 can be fitted into and fixed in the open front face of the container body 1 more firmly by the elastic reaction of the clamping pieces 25. This force to fix the lid 9 is determined so as to deform the seal gasket 15 to maintain the sealability of the transportation container and to ensure effective resistance to any pressure difference between inside and outside of the transportation container.

In the present embodiment, a bottom plate 3 made of synthetic resin such as a polycarbonate is detachably disposed to the central part of the base of the container body 1, but the bottom plate 3 may be formed in a variety of shapes and may be made of other synthetic resins. In addition, the positioning member 4 than approximately inverse-V-shape cross section may be directly provided in the base of-the container body 1. Further, it is also possible to vertically arrange a plurality of housing grooves 8 having an laid-down U-shaped cross section in parallel in the both left and right sides within the container body 1. Furthermore, although the present embodiment shows a seal gasket 15 made of, for example, a polyolefin group or polyethylene group thermoplastic elastomer or a silicone rubber, it is preferable to use a polyethylene group elastomer whose organic volatile components have been reduced and thermal stability has been improved by being subjected to a heat treatment or the like, and which comprises a soft component of polyester or polyethyl and hard components of aromatic polyesters, especially in order to reduce the contamination of the substrate.

Figure 8:
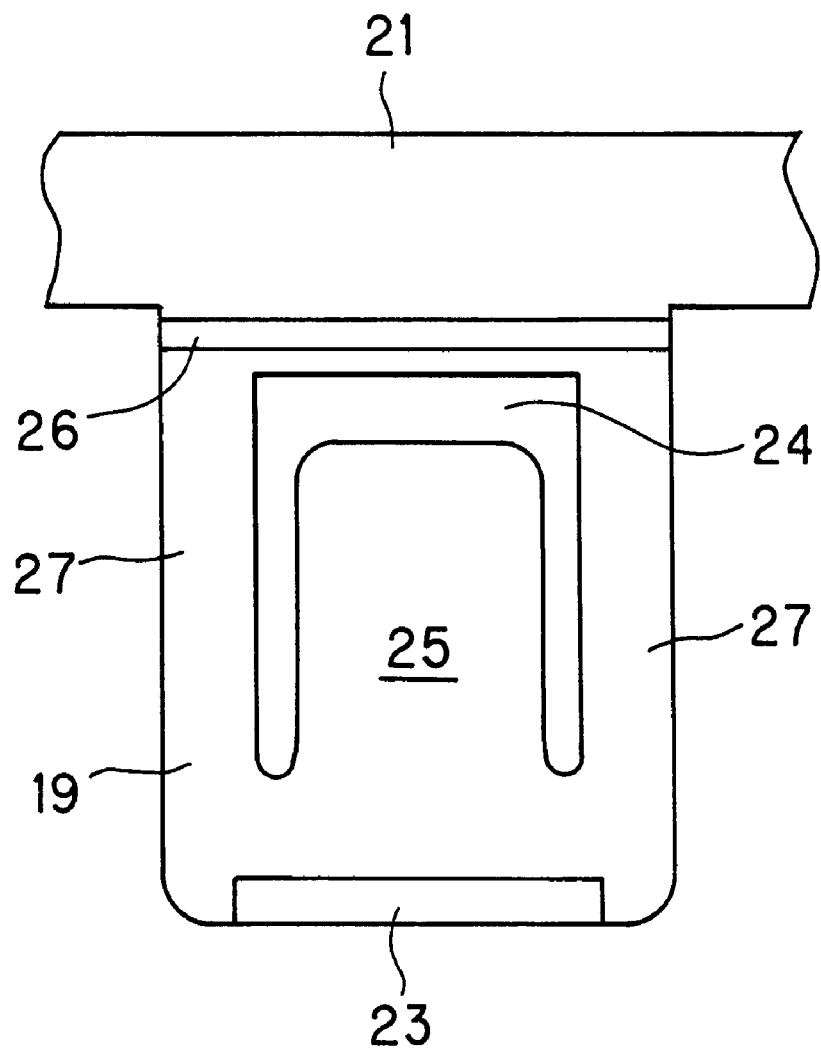
FIG. 8 is a view for use in describing a clamp plate of a locking mechanism of a transportation container according to another embodiment of the present invention.

Further, although in the present embodiment clamp plates 19 are journaled swingably in opposing sides of the lid 9, this does not impose any restriction to the present invention. By way of example, as shown in FIG. 8, the attachment shafts 21 for the clamp plates 19 are fixed to the opposing sides of the lid 9, and the swinging hinges 26 are formed linearly along the interface of the clamp plates 19 and attachment shafts 21 in such a way that the clamp plates 19 are able to swing around them. In addition, although not shown in the drawing, clamp parts may be directly connected to the lid 19 by way of a hinge 26. In addition, it is also possible to form the whole free end of the clamp plates 19 to be bent toward the front surface of the clamp plates 19, so that an operated part 23 for automatized operation is defined thereby. Furthermore, it is also possible to form part or all of the free end to be bent toward the rear face of the clamp plates 19 so that the operated parts 23 for automatized operation is defined thereby. Furthermore, the walls of the left/right sides 27 of the clamp plates 19 positioned by way of the groove holes 24 in the both left and right sides of the clamping pieces 25 may be made thinner so that the clamping pieces 25 can be bent more easily.

Next, a description will be given, with reference to the drawings, of a preferred embodiment of a device for performing a method of opening and closing the lid of a transportation container pertaining to the present invention, but the present invention is in no way limited to this embodiment.

The device for performing the method of the opening and closing of the lid of the transportation container pertaining to the present embodiment (FOSB device: Front Opening Shipping Box device) comprises, as shown in FIG. 9 to FIGS. 23A and 23B: a stand 40 which is adjacent to and opposing the FOUP device; a positioning carrier unit 50 which shifts the container body 1 of the above-described transportation container between an operation region 61 and a supply/discharge region 62; and an opening and closing unit 90 for attaching and detaching the lid 9 with respect to the container body 1 in the operation region 61, wherein the positioning carrier unit 50 and the opening and closing unit 90 are operated by a predetermined program.

Figure 9:
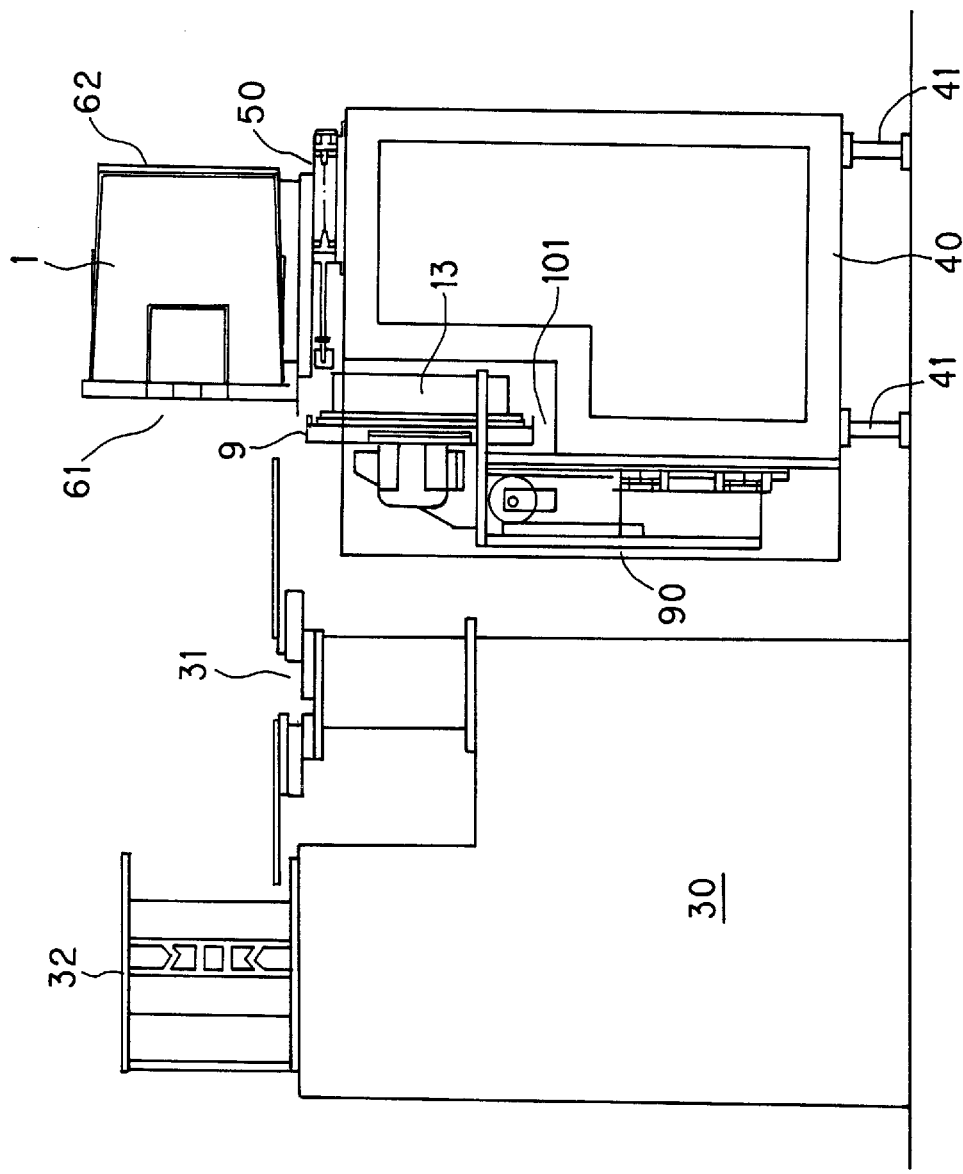
FIG. 9 is an entire view for use in describing a device for carrying out a method for opening and closing the lid of the transportation container according to an embodiment of the present invention.

The FOUP device 30, as shown in FIG. 9, comprises a structure in which a step-wise configuration is established in front, wherein a transferring device 31 for transferring semiconductor wafers W is disposed in the lower part in such a way that it is able to rotate and ascend and descend, and in the upper part, an empty production container 32 is set opposing the transportation container.

The stand 40, as shown in FIG. 9, comprises a structure in which a step-wise configuration is established in front, wherein running wheels not shown in the drawing are pivotally supported in a manner rotatable at the four corner of the base, and legs 41 which are able to move up and down are screwed into each of the wheels. In one rear side (upper left side in FIGS. 12 and 13) of the top face thereof, a ready button, open button, and close button and so on, which are not shown in the drawings, are arranged in a row. In the lower part of the front face of the stand 40, as shown in FIGS. 9, 10, 14 and 15, a front cover 42 is arranged upright and supported by screw attachment, and a space for the opening and closing unit 90 is defined between the front cover 42 and front face of the stand 40.

Figure 10:
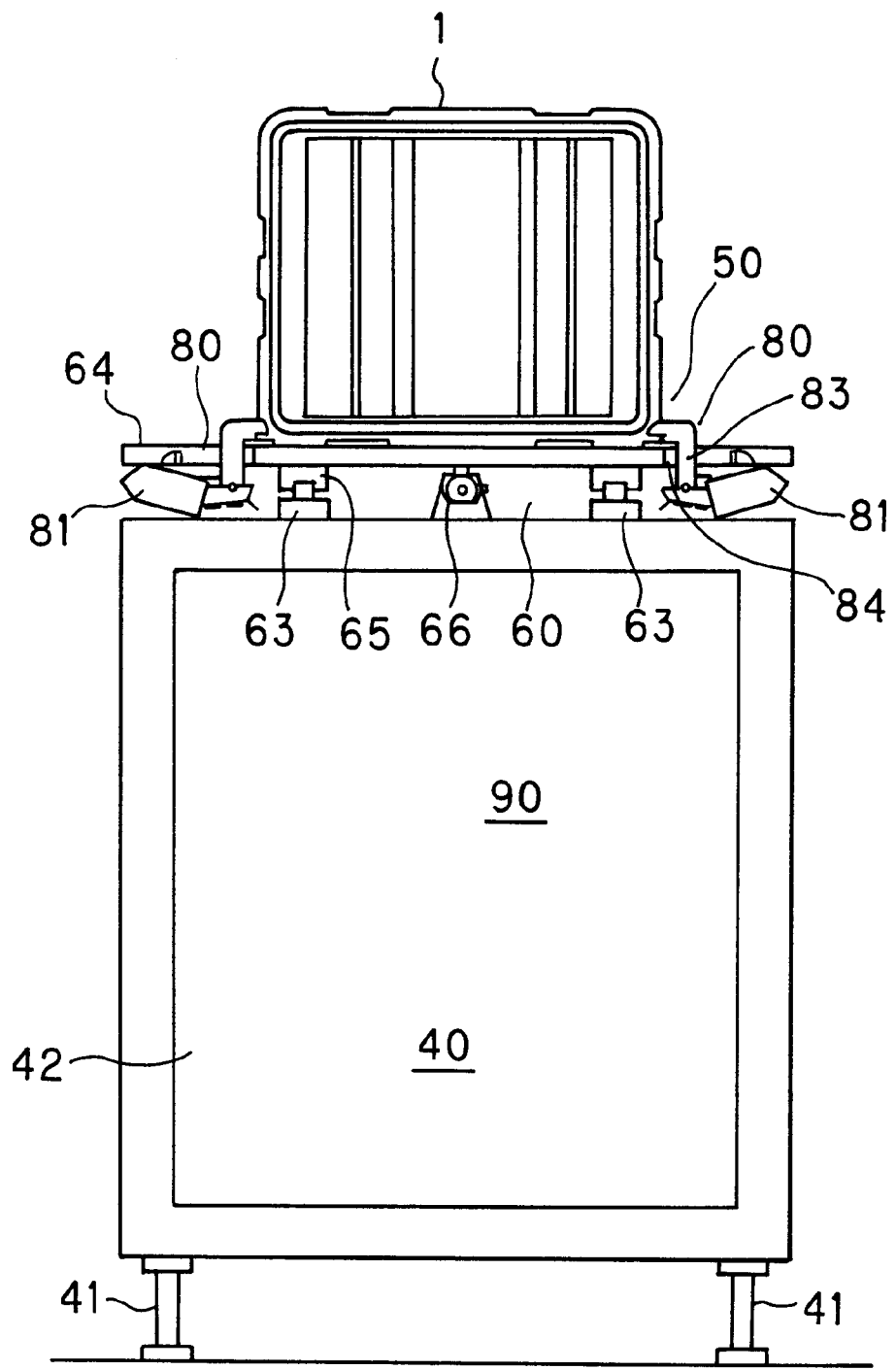
FIG. 10 is a front view illustrating a device for carrying out a method for opening and closing the lid of the transportation container according to an embodiment of the present invention.
Figure 14:
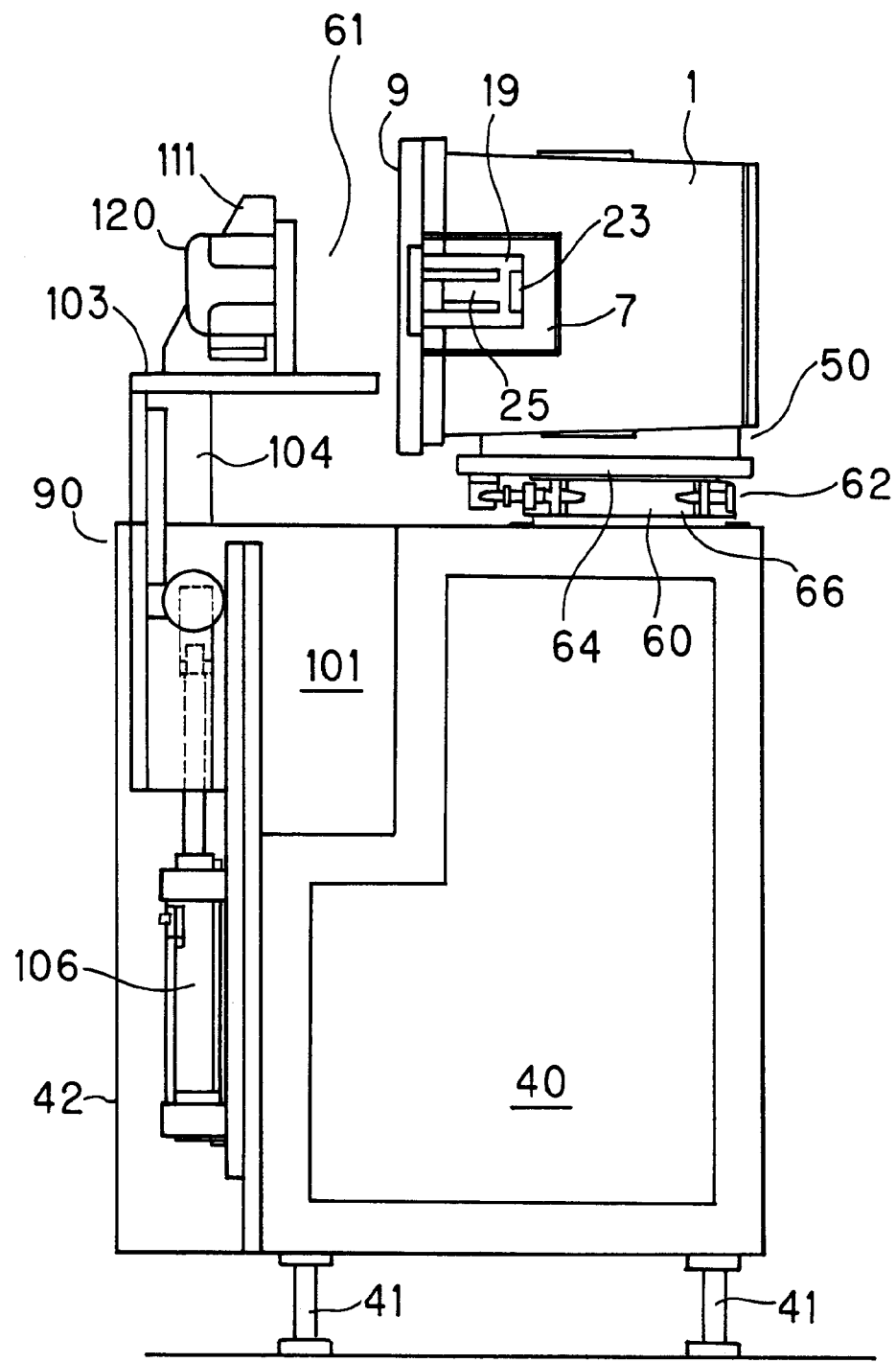
FIG. 14 is a side view of a device for carrying out a method for opening and closing the lid of the transportation container according to an embodiment of the present invention, in which the device is illustrated in the state before removing the lid.
Figure 15:
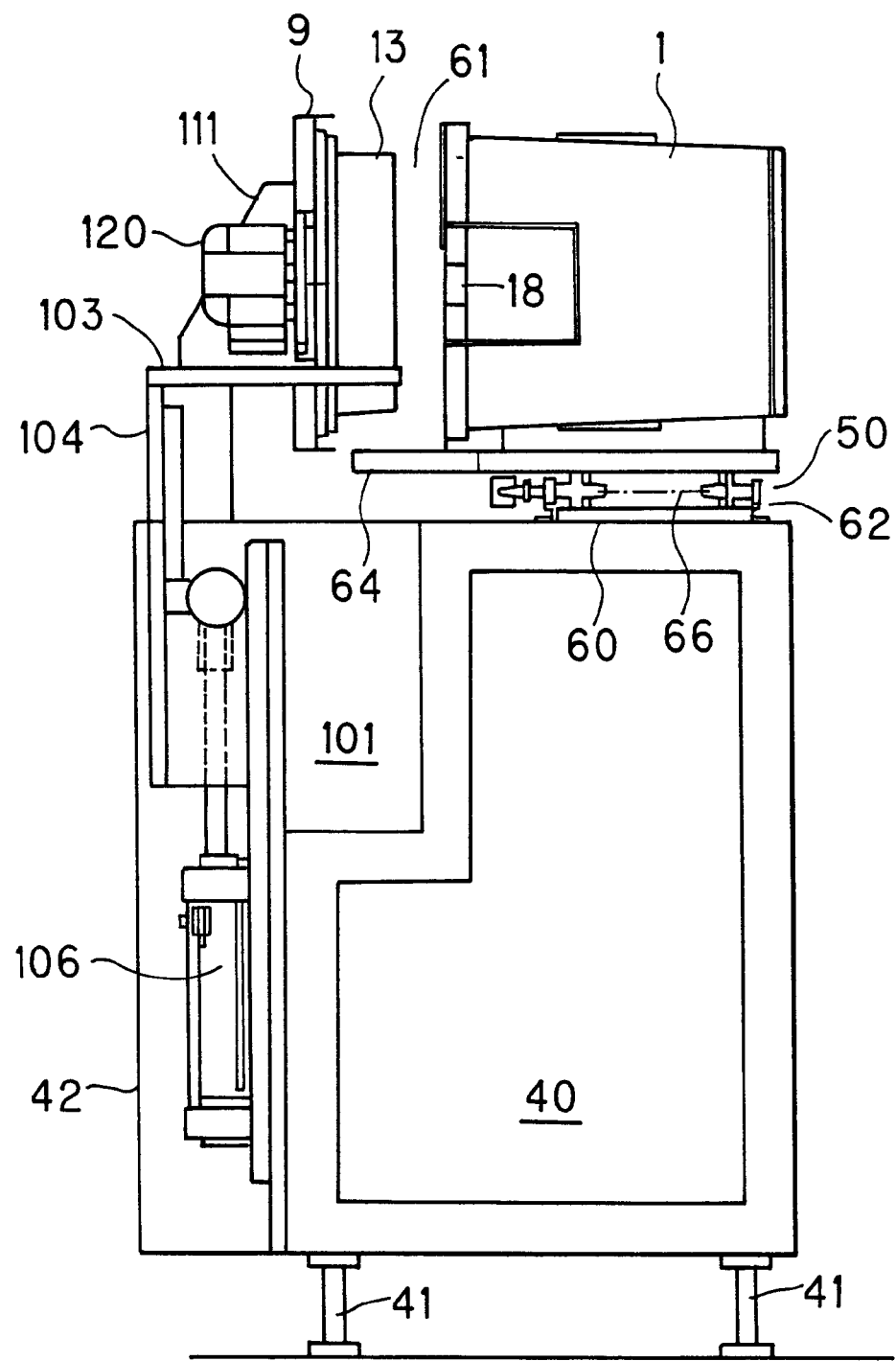
FIG. 15 is a side view of a device for carrying out a method for opening and closing the lid of the transportation container according to an embodiment of the present invention, in which the device is illustrated with removing the lid.
Figure 16:
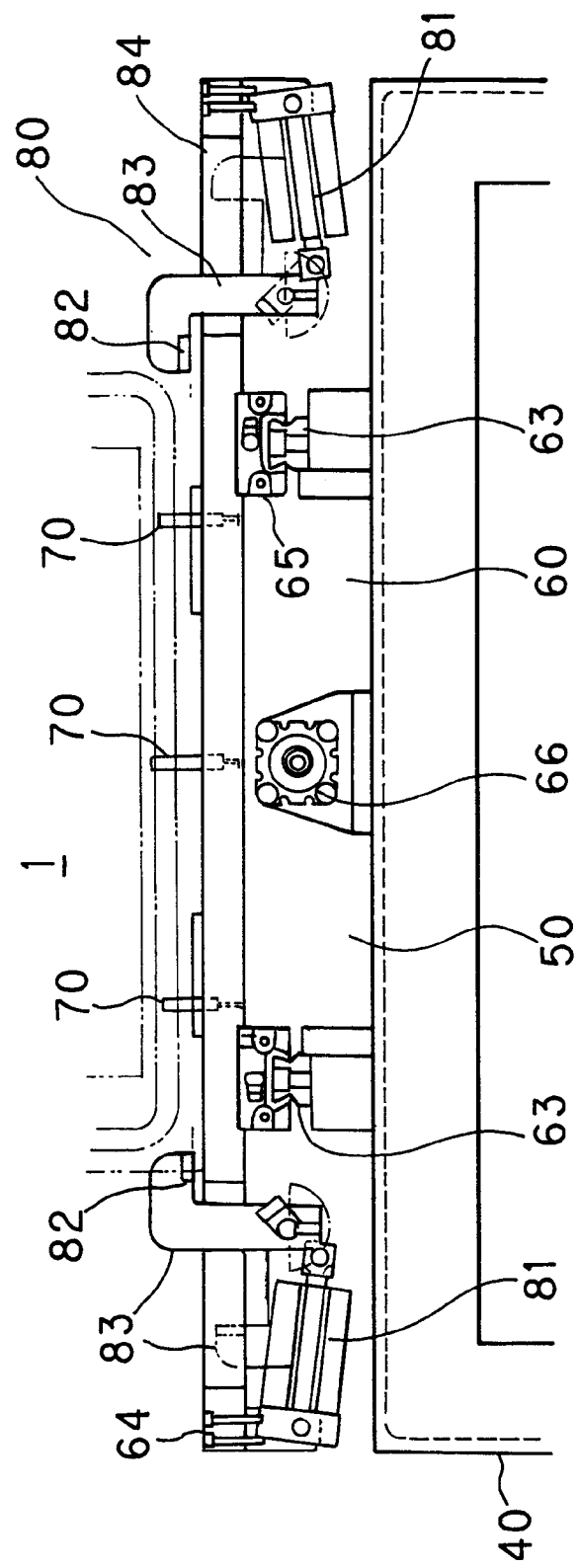
FIG. 16 is a front view illustrating in detail essentials of a transportation mechanism, positioning pins, and a fixing mechanism of a device for carrying out a method for opening and closing the lid of the transportation container according to an embodiment of the present invention.

The positioning carrier unit 50 comprises a transportation mechanism 60 for moving a mounting base 64 for mounting the containing body 1 back and forth between the operating region 61 and the supply/discharge region 62, a plurality of positioning pins 70 for positioning the container body 1 on the mounting base 64, and a fixing mechanism 80 for fixing the container body 1 which has been positioned on the mounting base 64. A carrier mechanism 60, as shown in FIGS. 10 and 14, comprises a pair of left/right linear rails 63 deployed horizontally between the operation region 61 in the front part on the top face of the stand 40 and the supply/discharge region 62 which constitutes the starting point of the rear part of the top face thereof, and the opposite sides of the lower face of the mounting base 64 are slidably fitted into these linear rails 63 by way of a plurality of linear motion guides 65. As shown in FIGS. 15 and 16, a first air cylinder 66, which has orientation in the rear-front direction on the top face of the stand 40, is arranged horizontally between the pair of linear rails 63, and the tip ends of the piston of the first air cylinder 66 are connected to the front part of the bottom face of the mounting base 64 by way of a joint.

Figure 12:
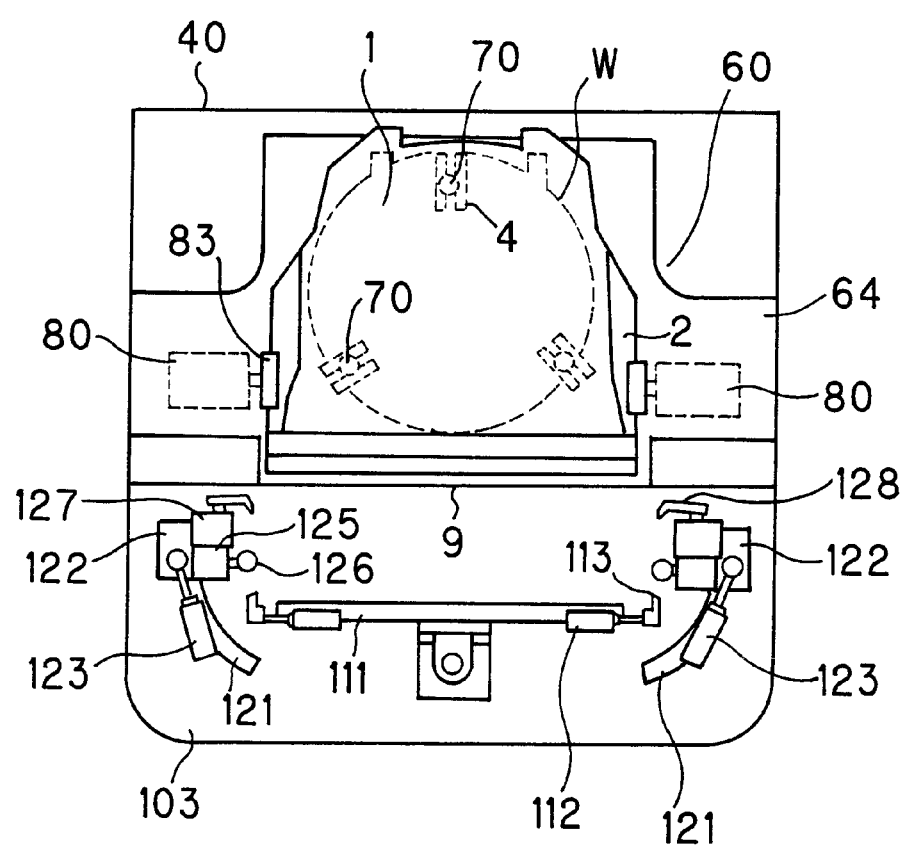
FIG. 12 is a plan view of a device for carrying out a method for opening and closing the lid of the transportation container according to an embodiment of the present invention.

The plurality of positioning pins 70, as shown in FIGS. 12 and 16, are planted vertically at positions established by the SEMI standards E1.9, that is to say, in the opposing sides of the front part of the flat surface of the mounting base 64 and at the center of the rear part thereof so that they are inserted and fitted in the plurality of positioning members 4 in the container body 1 whereby the container body 1 is positioned. The tip ends of the positioning pins 70 are rounded into an approximately semi-circular shape.

The fixing mechanism 80, as shown in FIGS. 10 and 16, comprises a pair of second air cylinders 81 pivotally supported at the opposite ends of the bottom of the mounting base 64 so as to be able to swing around the axis, and fixing arms 83 with pads 82 are pivotally supported at the tip end of the piston of the second air cylinders 81 by way of a joint, link or the like. This pair of fixing arms 83, as shown in the same drawings, are bent into an approximately L shape, and are pivotally supported on the opposite ends of the bottom of the mounting base 64 so as to be disposed protrudably as they swing around the axis. The arms 83 are exposed over the mounting base 64 by way of the through hole 84 by the drive of the second air cylinder 81, and are pressed against and lock the opposite sides of the bottom of the container body 1, namely the side edges of the bottom rail 2.

An opening and closing unit 90 comprises a lift mechanism 100 for lifting and lowering a flat support base 103 between the operation region 61 and a siding region 101 constituted by space; a clamp mechanism 110 for holding and fixing the lid 9; and an operation mechanism 120 which, when the lid 9 is to be removed, causes the clamp plate 19 of the locking mechanism 17 to swing into a release position where the lid can be removed, and, when the lid 9 is to be attached, causes the clamp plate 19 to swing to a close position where the lid 9 is fixed to the open front face of the container body 1.

Figure 11:
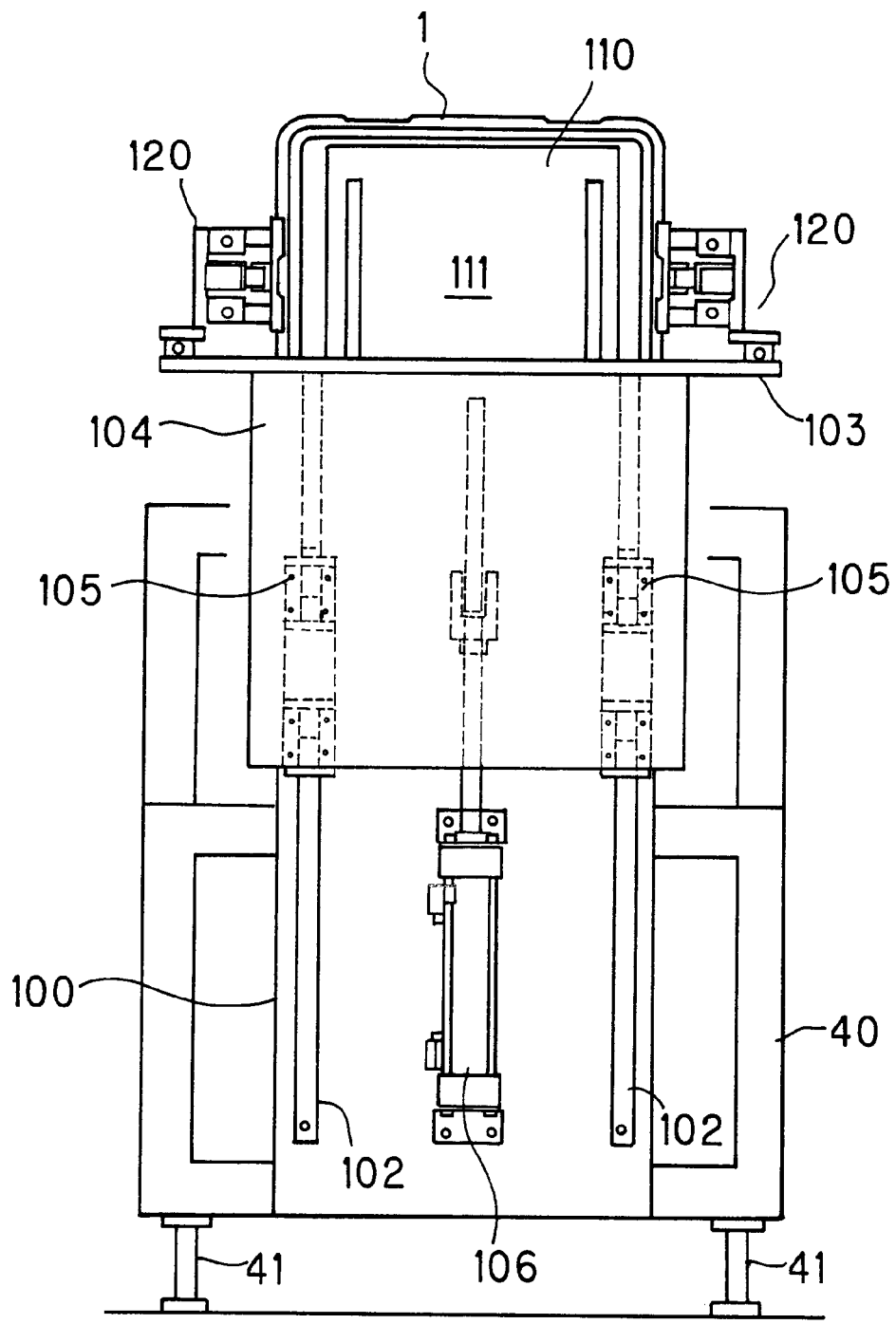
FIG. 11 is a front view for use in describing operations of a lift mechanism in a device for carrying out a method for opening and closing the lid of the transportation container according to an embodiment of the present invention.

The lift mechanism 100, as shown in FIG. 11, comprises a pair of lifting rails 102 provided vertically on the inner face of the front cover 42, and a lift section 104 extending downwards from the support base 103 having recesses is fitted with the pair of lift rails 102 by way of a plurality of linear motion guides 105 such that it can slide up and down along the rails. A third air cylinder 106 is mounted vertically between the pair of lift rails 102, and the upper end of the piston of the third cylinder 106 is connected to the support base 103 by way of a joint. In addition, a clamp mechanism 110, as shown in FIGS. 12 to 15, comprises an upright member 111 vertically disposed on the support base 103, and fourth air cylinders 112 are mounted sideways on the opposite sides of this upright member 111, and approximately J-shaped clamp arms 113 which lock to the sides of the lid 9 are mounted in the tip end of the pistons of the fourth air cylinders 112.

Figure 13:
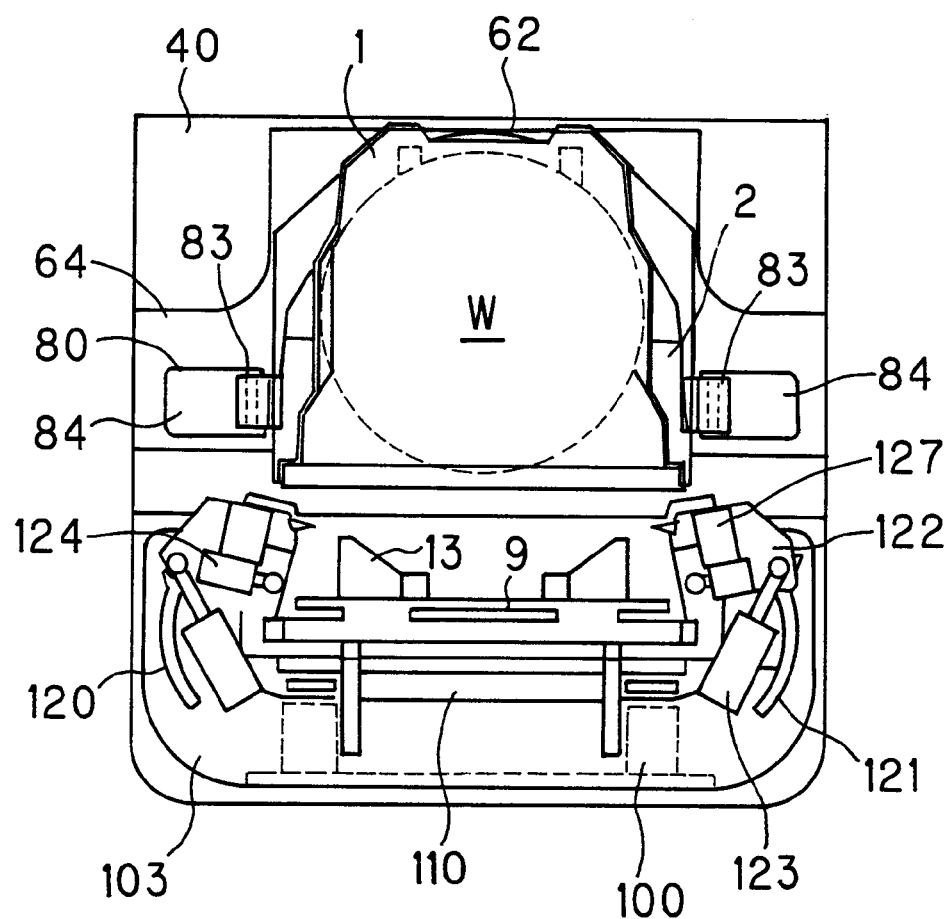
FIG. 13 is a plan view of a device for carrying out a method for opening and closing the lid of the transportation container according to an embodiment of the present invention, in which the device is illustrated in detail with removing the lid.

The operation mechanism 120, as shown in FIG. 13, etc., comprises a pair of curved rails 121 which are formed in an approximately semicircular arc shape and provided on the opposite ends of the support base 103, and slide plates 122 are engaged with the curved rails 121 by way of bearings so as to be slidable along the rails. Fifth air cylinders 123 are pivotally supported in the proximity of the curved rails 121 so as to be able to swing horizontally. Slide plates 122 are pivotally supported at the tip end of the pistons of the fifth air cylinders 123 so as to be swingable, and these slide plates 122 are caused to slide, by the drive of the fifth air cylinders 123, to approach or recede from the vicinity of the side part of the lid 9 fitted into the open front face of the container body 1 (see FIGS. 17A, 17B, 17C).

In addition, as shown in, for example, FIGS. 12, 13, 17A, 17B and 17C, sixth air cylinder 124 and seventh air cylinder 127 are mounted by way of support brackets 129 on the slide plates 122. Pressing arm 125 is mounted at the tip end of the piston of the sixth air cylinder 124, while a pressing roller 126 is pivotally supported in a manner rotatable at the tip end of the pressing arms 125. This pressing roller 126 functions to be pressed against or withdrawn from the surface of the clamping piece 25 of the clamp plate 19 from a generally opposing diagonal side. Furthermore, operation arms 128 of an approximately J-shape are mounted in the tip end of the pistons of the seventh air cylinders 127, so that the operation arms 128 are locked to or separated from the operated part 23 for the clamp plates 19 from the rear side of the container body 1.

Explanation will be given of a case in which, in the above-described configuration the lid 9 is removed by an automatic operation from the container body 1 of a transportation container which has been shipped from a substrate manufacturing plant, semiconductor wafers W are automatically transferred to a production container 32 from the transportation container, and the semiconductor wafers W are automatically supplied to a processing step. First, the container body 1 is mounted by means of a carrier robot or the like not shown in the drawing, on the mounting base 64 of a carrier mechanism 60, and the container body 1 is precisely positioned by means of a plurality of positioning pins 70 (see FIGS. 18A and 18B). When the container body 1 is mounted on the mounting base 64, a detector on the mounting base 64, not shown in the drawing, detects the container body 1, whereupon the opening and closing device for the lid 9 starts to operate in accordance with a predetermined program.

When the container body 1 is positioned and mounted, the second air cylinders 81 of the fixing mechanism 80 are driven to cause the piston to retreat, and the fixing arms 83 which have been retreated are swung to be exposed over the mounting base 64 through the through hole 84 and press down and lock the bottom rails 2 of the container body 1 by way of pads 82. When the container body is fixed in this way, the third air cylinders 106 of the lift mechanism 100 are driven causing the piston to project, and the support base 103, while being guided along the pair of lift rails 102, is caused to ascend from the siding region 101 to the operation region 61, wherein the clamp mechanism 110 is opposed to the upper half of the lid 9.

Subsequently, the first air cylinder 66 of the carrier mechanism 60 is driven causing the piston to project, and the mounting base 64, while being guided along the pair of linear rails 63, advances horizontally from the supply/discharge region 62 to the operation region 61. The fourth air cylinders 112 of the clamp mechanism 110 are driven to cause the piston to retreat wherein the opposite sides of the lid 9 fitted into the concave part of the support base 103 are held by the clamp arms 113 to be fixed (see FIGS. 19A and 19B). When the lid 9 is supported in this way, the seventh air cylinders 127 are driven causing the piston to project, and the operation arms 128 are clamped in the groove holes of the operated part 23 of the clamp plates 19 from the rear side of the container body 1 (see FIGS. 17A and 17B).

Prior to the locking of the operation arms 128, the angle θ1 between the reference line L and the clamp plates 19 is set within the range of −10 to −20 degrees, and following the locking of the operation arm 128, the angle θ2 between the reference line L and the clamp plates 19 is set within the range of −5 to −10 degrees. Further, when the operation arms 128 are locked to the operated parts 23 of the clamp plates 19, the pressing rollers 126 of the pressing arms 125 are opposed to the front face of the clamping pieces 25 of the clamp plates 19 from the diagonal side of the container body 1.

Figure 17C:
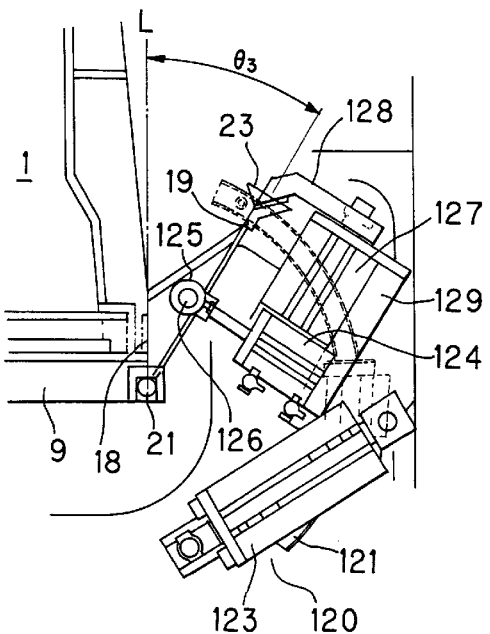
Figure 18A:
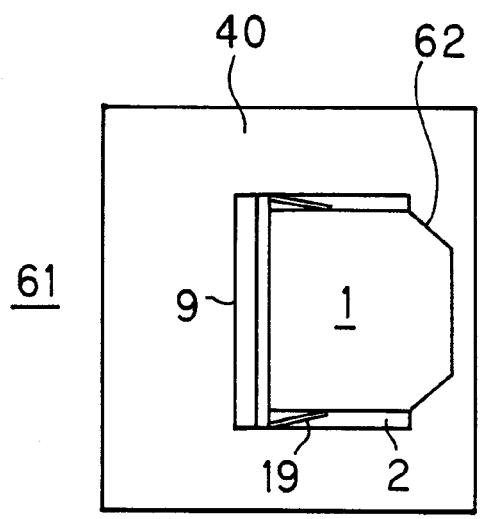
Figure 18B:
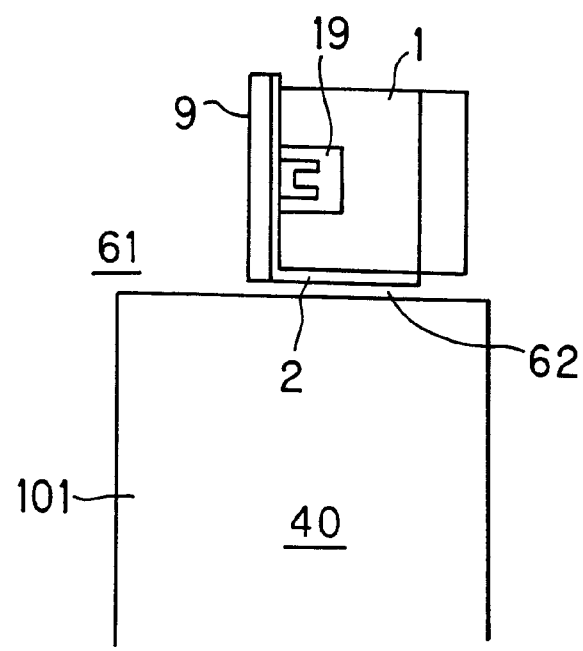
Figure 20A:
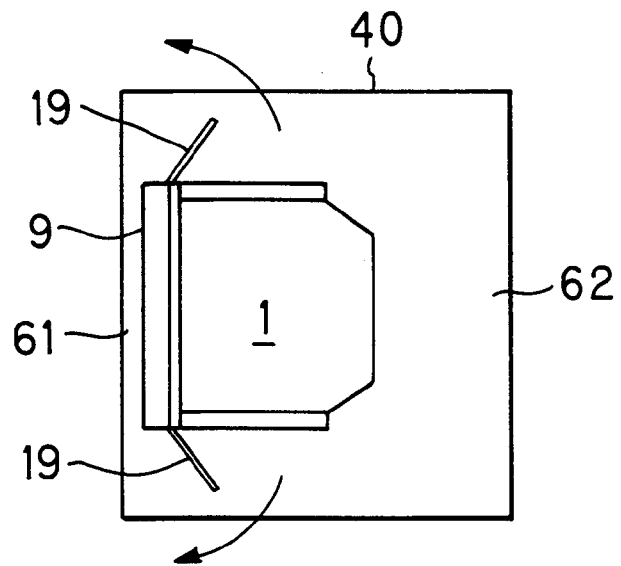
Figure 20B:
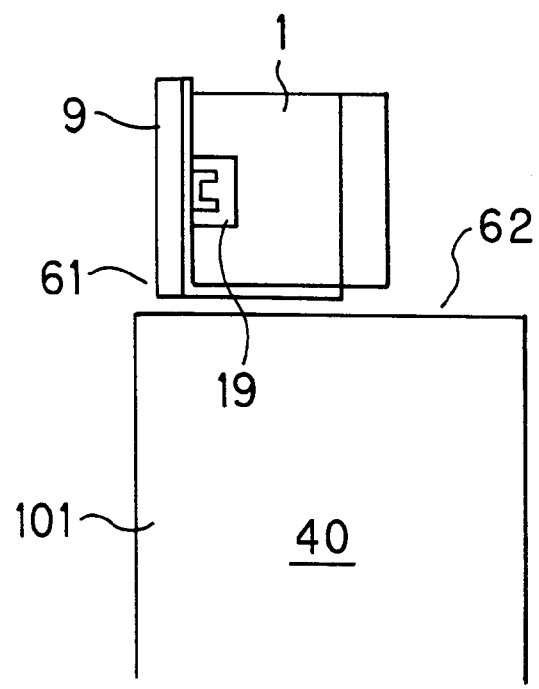

Subsequently, the fifth air cylinders 123 are driven causing the pistons to retreat, and the slide plates 122, while being guided along the curved rails 121, slide in the direction of the clamp mechanism 110 following an arc-shape course, and the clamp plates 19 are swung to be released (see FIGS. 17C, 20A and 20B and the arrows therein). At this time, the sixth air cylinders 124 are driven causing the pistons to project and the pressing rollers 126 of the pressing arms 125 are pressed against the front face of the clamping pieces 25 of the clamp plates 19, whereby the clamping pieces 25 are bent and released from the clamping grooves 20, and the clamp plates 19 are removed completely from the protrusions 18. In this case, the angle θ3 between the reference line L and the clamp plates 19 is within the range of 25 to 40 degrees.

Figure 21A:
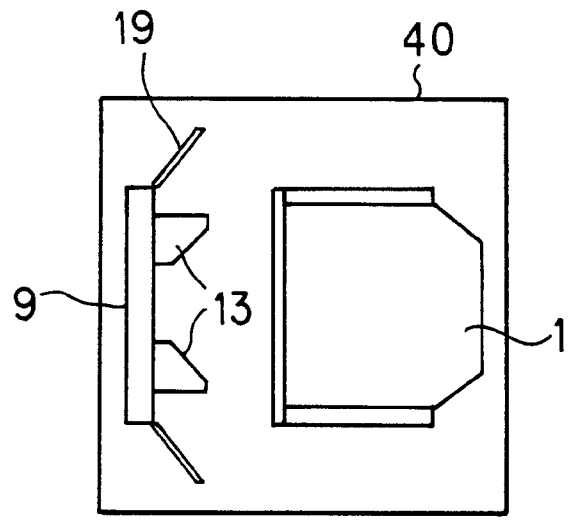
Figure 21B:
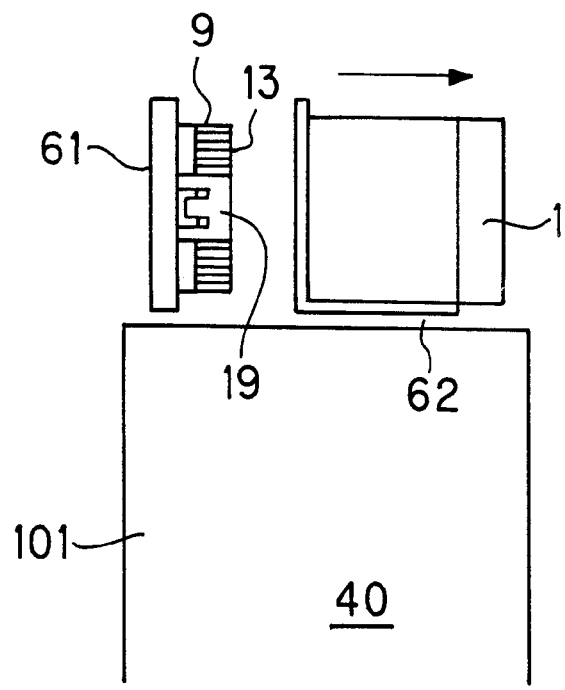
Figure 22A:
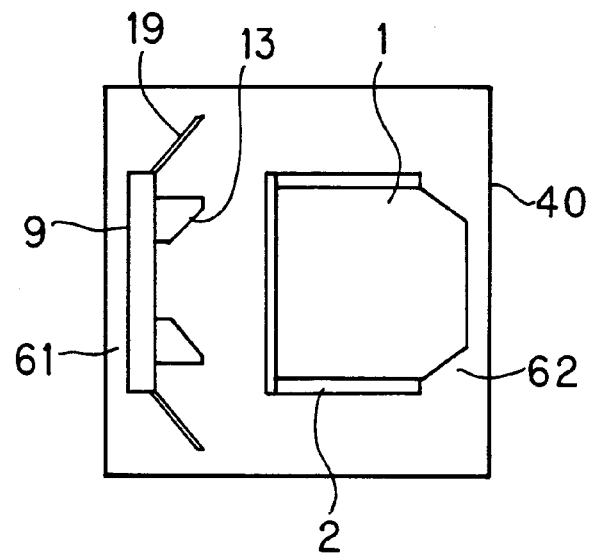
Figure 22B:
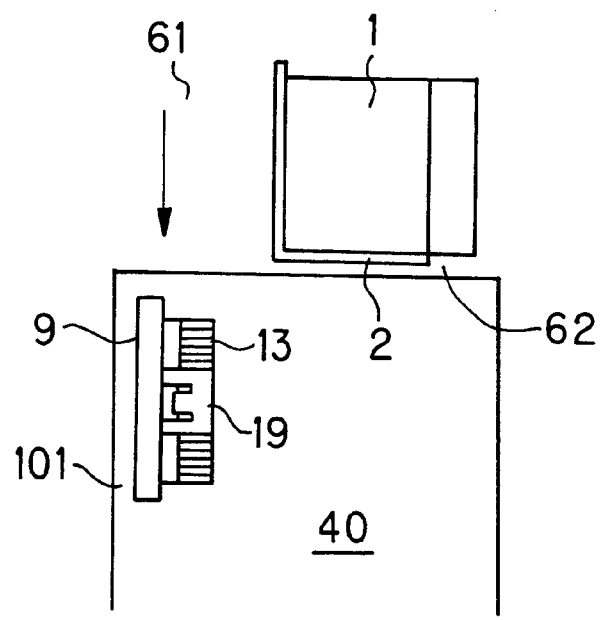

Next, the first air cylinder 66 of the carrier mechanism 60 is driven causing the piston to retreat, and the mounting base 64, while being guided along the pair of linear rails 63, retreats horizontally from the operation region 61 to the supply/discharge region 62, and the container body 1 is completely separated from the lid 9 (see FIGS. 21A and 21B). When the container body 1 is removed from the lid 9 in this way, the third air cylinder 106 is driven causing the piston to retreat and the support base 103, while being guided along the pair of lift rails 102, is lowered from the operation region 61 to the siding region 101, and is located below the mounting base 64 in such a way that the whole lid body does not obstruct the operation (see FIGS. 22A and 22B).

Figure 23A:
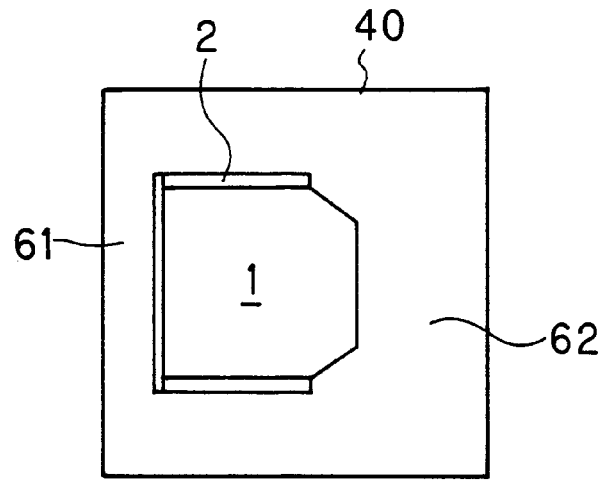
Figure 23B:
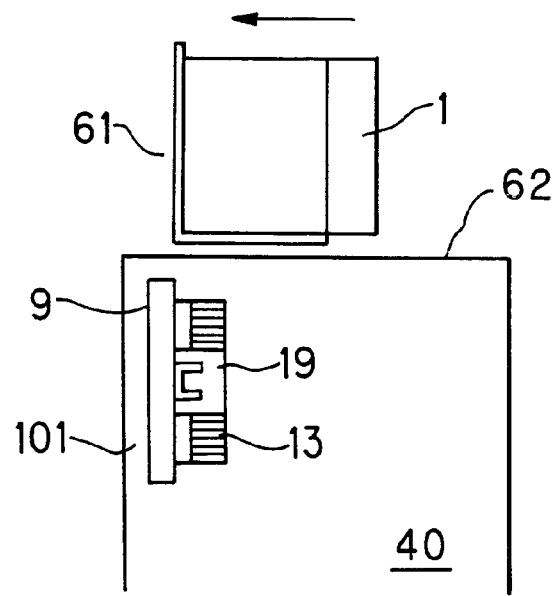

Next, the first air cylinder 66 is driven causing the piston to be projected again, and the mounting base 64, while being guided by the pair of linear rails 63, advances from the supply/discharge region 62 to the operation region 61 (see FIGS. 23A and 23B). This position and the wait position of the lid 9 can be set so as to satisfy the positional relationship for connection between a load port and other processing devices as established in the SEMI standard 63. A plurality of semiconductor wafers W in the production container 32 are then automatically and sequentially transferred from the transportation container to a production container 32 by means of a transferring device 31. Thereafter, the semiconductor wafers W are automatically supplied to the processing steps by a well-known method.

Next, in a semiconductor wafer manufacturing plant or semiconductor manufacturing plant, semiconductor wafers W are automatically transferred from a production container 32 to a transportation container 31, and a lid 9 is attached to the container body 1 of the transportation container by an automatic operation. When the transportation container is to be stored or shipped, firstly, the plurality of semiconductor wafers W are automatically and sequentially transferred from the production container 32 to the transportation container by means of a transferring device 31. When the semiconductor wafers W are transferred, the first air cylinder is driven causing the piston to retreat and the mounting base 64 in which the container body 1 has been positioned and mounted in advance retreats from the operation region 61 to the supply/discharge region 62, while being guided along the pair of linear rails 63.

Subsequently, the third air cylinder 106 is driven causing the piston to project, and the support base 103, while being guided along the pair of lift rails 102, ascends from the siding region 101 to the operation region 61 wherein the lid 9 which has been supported by the clamp mechanism 110 emerges in the operation region 61. When the lid 9 is exposed in this way, the first air cylinder 66 of the carrier mechanism 60 is driven causing the piston to project, and the mounting base 64, while being guided along the pair of linear rails 63, advances from the supply/discharge region 62 to the operation region 61, wherein the lid 9 is fitted into the open front face of the container body 1.

Next, the fifth air cylinders 123 are driven causing the pistons to project, and the slide plates 122, while being guided along the curved rails 121, slide to the vicinity of the sides of the lid 9 drawing an arc-shape course, and the clamp plates 19 which has been locked by the operation arms 128 are swung to close. At the same time, the sixth air cylinders 124 are driven causing the pistons to project, and the pressing rollers 126 of the pressing arms 125 are pressed against the surface of the clamping pieces 25 of the clamp plates 19, whereby the clamping pieces 25 are bent and inserted and fitted into the clamping grooves 20. When the lid 9 is fixed in the open front face of the container body 1 in this way, the seventh air cylinders 127 are driven causing the pistons to retreat, and the operation arms 128 are separated from the operated parts 23 of the clamp plates 19 toward the back of the container body 1.

The fourth air cylinders 112 of the clamp mechanism 110 are then driven causing the pistons to project, and the clamp mechanism 110 releases the lid 9. The first air cylinder 66 of the carrier mechanism 60 is driven causing the piston to retreat and the mounting base 64, while being guided along the pair of linear rails 63, retreats from the operation region 61 to the supply/discharge region 62. When the mounting base 64 retreats to the supply/discharge region 62 in this way, the third air cylinder 106 of the lift mechanism 100 is driven causing the piston to retreat again, and the support base 103, while being guided along the pair of lift rails 102, is lowered from the operation region 61 to the siding region 101 and the clamp mechanism 110 is located below the mounting base 64.

The second air cylinders 81 for the fixing mechanism 80 are then driven causing the pistons to project, wherein the exposed fixing arms 83 are swung from the mounting base 64 to be retreated within the through hole 84 to release the container body 1 from press lock. When the lock of the container body 1 is released in this way, the transportation container is carried from the mounting base 64 of the carrier mechanism 60 to a predetermined place by a carrier robot or the like, so that the transportation container is stored or shipped.

With the above-described configuration, as there is absolutely no need, as with the prior art, to press down the lid 9 to be pressed against and deform a seal gasket 15, or to press down the lid 9 evenly to engage the elastic hook 146 of the lid 9 with a clamp member 145 of the container body 1, the lid 9 can be set easily without the need for expertise or experience, and therefore such operation can be carried more smoothly, simply, rapidly and easily. Accordingly, the sealability and safety of transportation containers can be ensured by engaging the protrusions 18 and clamp plates 19 firmly, whereby not only easy manual handling of the lid but also automation in opening and closing the lid 9 can be realized. Further, by virtue of this automation, improvements to the degree of cleanliness of the region for opening/closing operation of the lid 9 can be achieved to eliminate contamination of semiconductor wafers W. Thus, semiconductor wafers W of high quality can be produced at good yield.

In addition, because of simple configuration, low-cost and large-scaled production of a high quality transportation containers can be expected. As there is no need for a mechanical latching mechanism, it is possible to prevent an increase in the complexity of configuration and increase in costs and soon. Since a deformed seal gasket 15 is interposed between the open part of the container body 1 and the lid 9, the sealability can be improved considerably and the degree of cleanliness can be maintained easily to prevent contamination of the semiconductor wafers W.

Figure 24A:
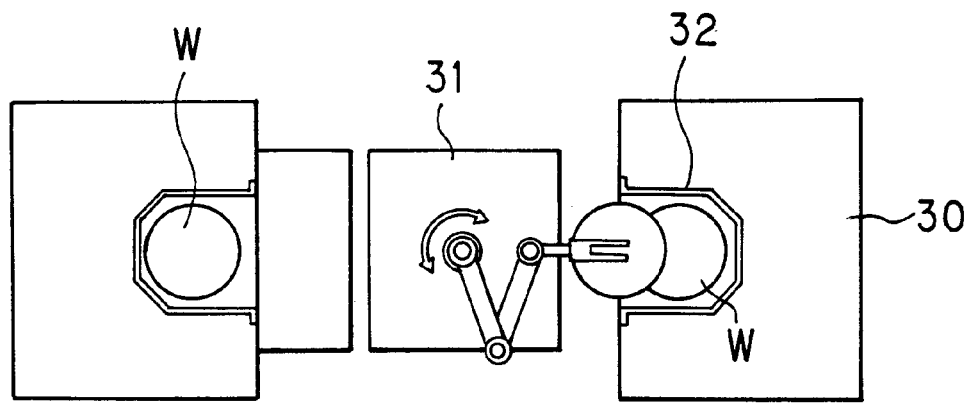
Figure 24B:
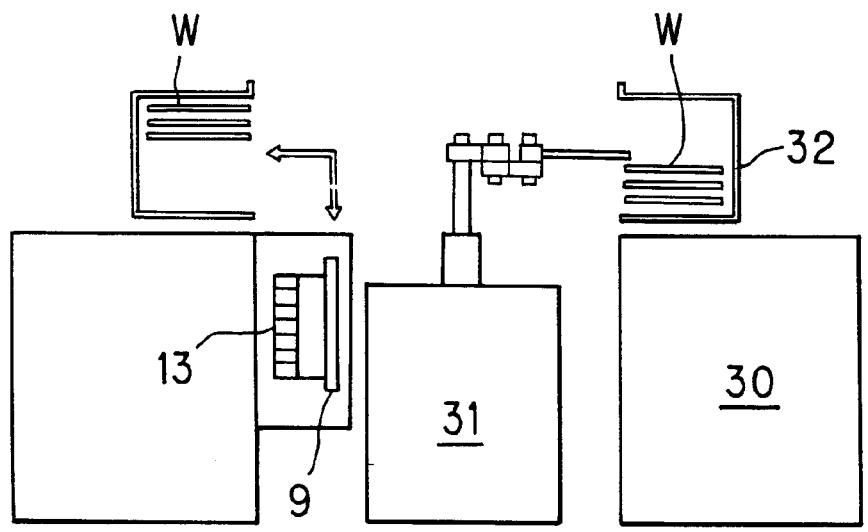

Further, since the mounting base 64 of the carrier mechanism 60 is only caused to advance and retreat in the horizontal direction between the operation region 61 and the supply/discharge region 62, and the support base 103 of the lift mechanism 100 is caused to ascend and descend only in the vertical direction between the siding region 101 and the operation region 61, it can be expected to simplify the structure, facilitate control, improve productivity, and reduce the required space. Explaining this point more particularly, as shown in FIGS. 24A and 24B, if the support base 103 of the lift mechanism 100 for example is constituted such as not only to ascend and descend but also to advance and retreat in the direction of the mounting base 64 (see the arrow of FIG. 24B), a space will be required for the drive mechanism for the advance/retreat movement, a plurality of guide rails, and additional actions of the components. In addition, drawbacks may arise from the point of view of positioning accuracy and reproducibility. Furthermore, there are risks that such device may interfere with carriers such as AGV (Auto Guided Vehicle) or OHT during transportation, and that it will be difficult to connect the device to various substrate processing devices in subsequent processes which are standardized according to the SEMI standards.

Conversely, in the present embodiment, since the functions of the carrier mechanism 60 and lift mechanism 100 are clearly differentiated to avoid a mechanism doing many functions, it is certainly possible to omit excessive strokes and spaces required for a drive mechanism for advance/retreat movement, a plurality of guide rails, and extra actions of the components. In addition, since the configuration is simple, there are no particular drawbacks arising in terms of the positioning precision and reproducibility of the lid 9 and the container body 1. In addition, there is no risk of interference with the carriers or the like such as an AGV or OHT, and connection with various substrate processing devices standardized according to the SEMI standards in subsequent processes also can be facilitated.

Furthermore, since air cylinders 66, 81, 106, 112, 123, 124, and 127 are used as first to seventh drivers, it can be expected to facilitate energy storage, to prevent contamination of the surrounding environment, to realize easy linear movement, and to improve operability and handling properties. Furthermore, since pressing rollers 126 are rotatably supported at the tip end of the pressing arms 125 and slidably contacted with the surface of the clamping pieces 25, it is possible to control and prevent generation of dust as a result of friction.

The number and form of the linear rails 63, fixed arms 83, lift rails 102, support base 103, clamp arms 113, curved rails 121, pressing arms 125 and/or operation arms 128 as mentioned in the above description of the embodiment can be changed as appropriate, provided that similar effects can be obtained after such change. Further, in the above-described embodiment, the lift mechanism 100 is operated to cause the support base 103 to ascend from the siding region 101 to the operation region 61 after the container body 1 has been positioned, but the support base 103 may be caused to ascend from the siding region 101 to the operation region 61 prior to the positioning of the container body 1. Furthermore, when the lid 9 is automatically attached to the container body 1, the support base 103 may be caused to ascend in advance to the operation region 61, and the lid 9, which is supported by the clamp mechanism 110, may be caused to emerge in the operation region 61.

As is described above, according to the present invention, provided can be a transportation container which ensures sealability, safety and durability for preventing contamination of precision substrates contained therein, and which is therefore suitable for automation.

Further, according to the present invention, an opening and closing method for transportation container lid that is suitable for the above described transportation container is also provided.

Still further, according to the present invention, the function of the carrier mechanism is limited to horizontal transporting function only, while avoiding the mechanism doing many functions, whereby it is possible to omit drive mechanisms for other functions, a plurality of guide members, and additional strokes and spaces for additional actions. Since the constitution is simplified by that much, it is possible to improve positioning precision and reproducibility of the lid and container body and the like.

Furthermore, according to the present invention, the function of the lift mechanism is limited to lifting function only. Therefore, it is possible to omit drive mechanisms for advancing and retreating motion, a plurality of guide members and additional strokes and spaces for additional actions. Since the configuration is thus simplified considerably, it can be expected to improve the positioning precision and reproducibility related to the lid and container body. Further, there is no risk of interference with other carrier in the vicinity, and the device of the present invention can be easily connected to various substrate processing devices.

What is claimed is:

1. A transportation container comprising:

a container body for housing precision substrates;

a detachable lid adapted to engage in and cover an open end face of said container body via a seal gasket; and a locking mechanism adapted to fix said lid engaged into the open end face of said container body, said locking mechanism having a pair of protrusions formed at the opposing sides of a rim of the open end face of said container body, and having a pair of clamp plates which are swingably journaled on opposing sides of said lid to clamp the protrusions, each protrusion having, on the back thereof, a groove to be clamped, each clamp plate having an attachment shaft for said lid formed in one end of the clamp plate and an engaging section formed at the other end of the clamp plate, each clamp plate being provided with an approximately U-shaped groove to be fitted with the protrusion, thereby a clamping piece of an approximately rectangular shape being allowed to be inserted and fitted in the clamping groove, such that it is adapted to be bent in the thickness direction of said clamp plate.

2. A transportation container as claimed in claim 1, wherein each clamp plate is formed with a synthetic resin and at least a part of the other end of the clamp plate is bent in the direction either toward the front or the back side of the clamp plate to define the engaging section, one or more rotation-restricting projections being provided around the attachment shaft.

3. A transportation container as claimed in claim 1, wherein a bottom plate, made of a synthetic resin, is detachably disposed to the center of the base of said container body.

4. A transportation container as claimed in claim 1, wherein a positioning member with a cross section of approximately inverse V-shape is arranged at the base of said container body.

5. A transportation container as claimed in claim 1, wherein a plurality y of housing grooves having a cross section of laid-down U-shape are vertically arranged in parallel in the opposing left and right sides inside said container body.

6. A transportation container as claimed in claim 1, wherein the attachment shafts for the clamp plates are fixed to the opposing sides of said lid, and swinging hinges are formed linearly along the interface of the clamp plates and attachment shafts in such a way that the clamp plates are able to swing around them.

7. A transportation container as claimed in claim 1, wherein the clamping piece comprises a resilient tongue defined by the U-shaped groove.

8. A transportation container as claimed in claim 1, wherein the clamping groove has a generally semi-circular shape and a free end of the clamping piece has a chamfered edge that is complementary to the shape of the of clamping groove so that the chamfered edge can be inserted and retained within the clamping groove.

9. A transportation container as claimed in claim 1, wherein the beveled section is contained within a plane that is separate from a plane containing the clamping piece.

10. A transportation container as claimed in claim 1, wherein said clamping piece has a first end proximate to the beveled section and an opposing free second end that faces the side of the lid where the clamp plate is swingably journaled.

11. A transportation container comprising:

a container body for housing precision substrates;

a detachable lid adapted to engage in and cover an open end face of said container body via a seal gasket that is provided on one side of the lid; and a locking mechanism adapted to fix said lid engaged into the open end face of said container body, said locking mechanism having a pair of protrusions formed at the opposing sides of a rim of the open end face of said container body, and having a pair of clamp plates which are pivotally coupled to opposing sides of said lid to clamp the protrusions, each protrusion having, on a back thereof, a groove to be clamped, each clamp plate having an attachment means for pivotally attaching the clamp plate to the lid, the attachment means being formed in a first end of the clamp plate, each clamp plate having a slot formed therein for receiving the protrusion, the slot defining a clamping piece that has a shape and size such that it can be inserted and fitted in the clamping groove, the clamping piece being a resilient member such that it is adapted to be bent in the thickness direction of said clamp plate.

12. A transportation container as claimed in claim 11, wherein the slot is an approximately U-shaped slot that defines the clamping piece which is in the form of a resilient tongue.

13. A transportation container as claimed in claim 11, wherein the attachment means comprises an attachment shaft provided at the first end of the clamp plate, the attachment shaft being pivotally coupled to the lid so to permit the clamp plate to be pivot along an axis relative to the lid.

14. A transportation container as claimed in claim 13, wherein each attachment shaft includes one or more rotation-restricting projections that are formed on an outer surface of the attachment shaft.

15. A transportation container as claimed in claim 11, further including:

a beveled section formed at a second end of the clamp piece, the beveled section including a surface that lies in a plane outside of a plane containing the clamp piece.

16. A transportation container as claimed in claim 11, wherein the attachment means comprises an attachment shaft that is fixed to one side of the lid, and a swinging hinge are formed linearly along an interface of one clamp plate and the attachment shaft in such a way that the clamp plate is able to swing around the attachment shaft.

* * * * *